(12) United States Patent
Degner et al.

(10) Patent No.: US 9,419,065 B2
(45) Date of Patent: Aug. 16, 2016

(54) FLEXIBLE DISPLAYS

(71) Applicant: Apple Inc., Cupertino, CA (US)

(72) Inventors: Brett W. Degner, Menlo Park, CA (US); Chieh-Wei Chen, Cupertino, CA (US); Dinesh C. Mathew, Fremont, CA (US); Paul S. Drzaic, Morgan Hill, CA (US); Sang Ha Kim, Dublin, CA (US); Silvio Grespan, Shanghai (CN); John Z. Zhong, Cupertino, CA (US); Jean-Pierre Guillou, San Francisco, CA (US); Kuo-Hua Sung, San Jose, CA (US); Young Bae Park, San Jose, CA (US); Vasudha Gupta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/932,834

(22) Filed: Jul. 1, 2013

(65) Prior Publication Data
US 2014/0042406 A1    Feb. 13, 2014

Related U.S. Application Data

(60) Provisional application No. 61/680,679, filed on Aug. 7, 2012, provisional application No. 61/681,509, filed on Aug. 9, 2012, provisional application No. 61/748,705, filed on Jan. 3, 2013.

(51) Int. Cl.
*H01L 29/82* (2006.01)
*H01L 27/32* (2006.01)
(Continued)

(52) U.S. Cl.
CPC ........ *H01L 27/326* (2013.01); *G02F 1/133305* (2013.01); *H05K 1/028* (2013.01);
(Continued)

(58) Field of Classification Search
CPC .................................................. H01L 27/3253
USPC ........................................... 257/40; 313/504
See application file for complete search history.

(56) References Cited

U.S. PATENT DOCUMENTS

| 4,507,170 A | 3/1985 | Myhre |
| 5,694,190 A | 12/1997 | Matsumoto et al. |

(Continued)

FOREIGN PATENT DOCUMENTS

| CN | 102568377 | 7/2012 |
| EP | 1533852 | 5/2005 |

(Continued)

*Primary Examiner* — Cuong Q Nguyen
*Assistant Examiner* — Nishath Yasmeen
(74) *Attorney, Agent, or Firm* — Treyz Law Group, P.C.; Kendall P. Woodruff

(57) ABSTRACT

An electronic device may be provided with an organic light-emitting diode display with minimized border regions. The border regions may be minimized by providing the display with bent edge portions having neutral plane adjustment features that facilitate bending of the bent edge portions while minimizing damage to the bent edge portions. The neutral plane adjustment features may include a modified backfilm layer of the display in which portions of the backfilm layer are removed in a bend region. A display device may include a substrate, a display panel on the substrate having display pixels, and peripheral circuitry proximate the display panel and configured to drive the display pixels. A portion of the periphery of the substrate may be bent substantially orthogonal to the display panel to reduce an apparent surface area of the display device. The bent portion may include an electrode for communication with the peripheral circuitry.

26 Claims, 22 Drawing Sheets

(51) Int. Cl.
 *G02F 1/1333* (2006.01)
 *H05K 1/02* (2006.01)
 *H05K 1/18* (2006.01)

(52) U.S. Cl.
 CPC .... *G02F2001/133388* (2013.01); *H05K 1/189* (2013.01); *H05K 2201/09036* (2013.01); *H05K 2201/0979* (2013.01); *H05K 2201/10128* (2013.01)

(56) References Cited

U.S. PATENT DOCUMENTS

| | | | |
|---|---|---|---|
| 5,717,556 | A | 2/1998 | Yanagida |
| 5,777,855 | A | 7/1998 | Yokajty |
| 6,104,464 | A * | 8/2000 | Adachi et al. .................. 349/150 |
| 6,201,346 | B1 | 3/2001 | Kusaka |
| 6,483,714 | B1 | 11/2002 | Kabumoto et al. |
| 6,498,592 | B1 | 12/2002 | Matthies |
| 6,633,134 | B1 | 10/2003 | Kondo |
| 6,717,057 | B1 | 4/2004 | Segall et al. |
| 7,816,856 | B2 | 10/2010 | Cok et al. |
| 8,106,309 | B2 † | 1/2012 | Hwang |
| 8,319,725 | B2 † | 11/2012 | Okamoto et al. |
| 8,434,909 | B2 | 5/2013 | Nichol et al. |
| 8,492,969 | B2 | 7/2013 | Lee et al. |
| 2002/0097352 | A1 | 7/2002 | Houdeau |
| 2005/0078099 | A1 | 4/2005 | Amundson et al. |
| 2005/0212419 | A1 | 9/2005 | Vazan et al. |
| 2006/0231844 | A1 | 10/2006 | Carter |
| 2008/0024060 | A1 | 1/2008 | Jonnalagadda et al. |
| 2008/0241549 | A1 * | 10/2008 | Seon ........................ C08J 7/047 428/411.1 |
| 2008/0248191 | A1 | 10/2008 | Daniels |
| 2009/0021666 | A1 * | 1/2009 | Chen ................. G02F 1/133305 349/58 |
| 2009/0148678 | A1 * | 6/2009 | Hwang ................ H05K 1/0281 428/209 |
| 2009/0189835 | A1 | 7/2009 | Kim et al. |
| 2010/0148654 | A1 | 6/2010 | Yan et al. |
| 2010/0308335 | A1 | 12/2010 | Kim et al. |
| 2010/0308355 | A1 | 12/2010 | Hsieh et al. |
| 2011/0007042 | A1 | 1/2011 | Miyaguchi |
| 2011/0241563 | A1 | 10/2011 | Kim et al. |
| 2012/0146886 | A1 * | 6/2012 | Minami ............. H01L 27/3276 345/80 |
| 2012/0208306 | A1 | 8/2012 | Haas et al. |
| 2012/0307423 | A1 † | 12/2012 | Bohn et al. |
| 2013/0026505 | A1 | 1/2013 | Lee et al. |
| 2013/0081756 | A1 | 4/2013 | Franklin et al. |
| 2013/0112984 | A1 | 5/2013 | Kim et al. |
| 2013/0180882 | A1 | 7/2013 | Hamers et al. |
| 2014/0042406 | A1 | 2/2014 | Degner et al. |
| 2014/0092338 | A1 † | 4/2014 | Miyazaki et al. |
| 2014/0184057 | A1 | 7/2014 | Kim et al. |
| 2014/0240985 | A1 | 8/2014 | Kim et al. |
| 2014/0299884 | A1 | 10/2014 | Park et al. |

FOREIGN PATENT DOCUMENTS

| | | | |
|---|---|---|---|
| JP | 2008033095 | | 2/2008 |
| JP | 2009-094099 | † | 4/2009 |
| JP | 2012-128006 | * | 5/2012 |
| JP | 2012128006 | | 7/2012 |
| JP | 2012128006 A | * | 7/2012 |
| TW | 548185 | | 8/2003 |
| TW | 201002125 | | 1/2010 |
| TW | 201044899 | | 12/2010 |
| TW | M429927 | | 5/2012 |
| TW | 201229179 | | 7/2012 |
| WO | 0027172 A1 | | 5/2000 |
| WO | 2008001051 | | 1/2008 |
| WO | 2012078040 | | 6/2012 |

\* cited by examiner
† cited by third party

FLEXIBLE DISPLAYS

This application claims priority to U.S. provisional patent application No. 61/680,679, filed Aug. 7, 2012, U.S. provisional patent application No. 61/681,509, filed, Aug. 9, 2012, and U.S. provisional patent application No. 61/748,705, filed Jan. 3, 2013 which are hereby incorporated by reference herein in their entirety.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders. The housing of an electronic device can be adjusted to accommodate a bulky display with large borders, but this can lead to undesirable enlargement of the size and weight of the housing and unappealing device aesthetics.

Conventionally, assembled flat panel displays include a display panel, additional circuit elements, and a variety of peripheral circuitry configured to drive the display panel. The additional circuit elements may comprise gate drivers, emission (source) drivers, power (VDD) routing, electrostatic discharge (ESD) circuitry, demux circuits, data signal lines, cathode contacts, and other functional elements. The peripheral circuitry may also have integrated circuits providing various driver functions (driver chips) bonded to the display panel in this region. The peripheral circuitry may populate a significant portion of the display panel in active matrix displays, and may further populate areas proximate the display panel and coplanar with the display panel such that an overall surface area of an assembled display is significantly larger than the display panel itself.

Accordingly, manufacturers include border housings disposed to cover and obscure peripheral circuitry and other non-active display areas from end users in the assembled displays, resulting in increases in size and weight. Some manufacturers employ display border reduction techniques in an attempt to reduce relative size of border housings and in order to enhance an overall aesthetic of assembled displays.

However, display border reduction techniques, including high density peripheral circuitry, power routing, and other technologies currently still require relatively large border housings to entirely obscure peripheral circuitry and other non-active display areas.

Flexible display technologies offer alternative reduction techniques, including permanent bending of outlying display areas to reduce planar surface area as seen from a vantage point in front of an assembled display, while still allowing for arrangement of peripheral circuitry proximate associated display panel areas. However, if care is not taken, permanent bends in flexible displays may result in reduced reliability or component failure, increases in resistivity in outlying electrode connections, and other drawbacks including a minimum radius of curvature too large to garner any significant benefit in display border reductions.

It would therefore be desirable to be able to provide improved displays for electronic devices.

SUMMARY

An electronic device may be provided with a display such as an organic light-emitting diode display. The display may include organic light-emitting diode structures that include a layer of organic light-emitting material that is interposed between an encapsulation layer and a polymer layer having an array of thin-film transistors. The organic light-emitting diode structures may include a support layer such as a back-film layer formed from a second polymer material and attached to the polymer layer.

The display may include other layers such as a transparent cover layer and a layer of touch-sensitive electrodes. The touch-sensitive electrodes may be formed from transparent conductive material such as indium tin oxide and may be formed on an interior surface of the transparent cover layer or may be formed on a separate touch sensor substrate.

The organic light-emitting diode structures may include a planar central portion that is attached to the touch-sensitive components on the cover layer. The organic light-emitting diode structures may include bent edge portions that are bent away from the plane of the planar central portion. The bent edge portions may be coupled to additional circuitry in the device. The bent edge portions may include neutral plane adjustment features that allow the bent edge portions to be bent with a bending radius that is smaller than the bending radius of a conventional bent edge display. Providing a display with bent edge portions may reduce the size of an inactive border region of the display by forming display circuitry such as display signal lines away from the front surface of the device.

According to some exemplary embodiments, a display device with a reduced border region includes a substrate, a display panel arranged on the substrate comprising a plurality of display pixels, and peripheral circuitry arranged on the substrate proximate the display panel and configured to drive the plurality of display pixels. A portion of the periphery of the substrate is bent substantially orthogonal to the display panel to reduce an apparent surface area of the display device. The bent portion includes at least one electrode for communication with the peripheral circuitry.

According to other exemplary embodiments, a method of forming a display device includes forming a first substrate on a second rigid substrate, forming a display panel and peripheral circuitry configured to drive the display panel on the first substrate, separating the first substrate from the second rigid substrate, attaching a third flexible substrate to the first substrate, and bending the display device along at least one axis lying in the plane of the display panel.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
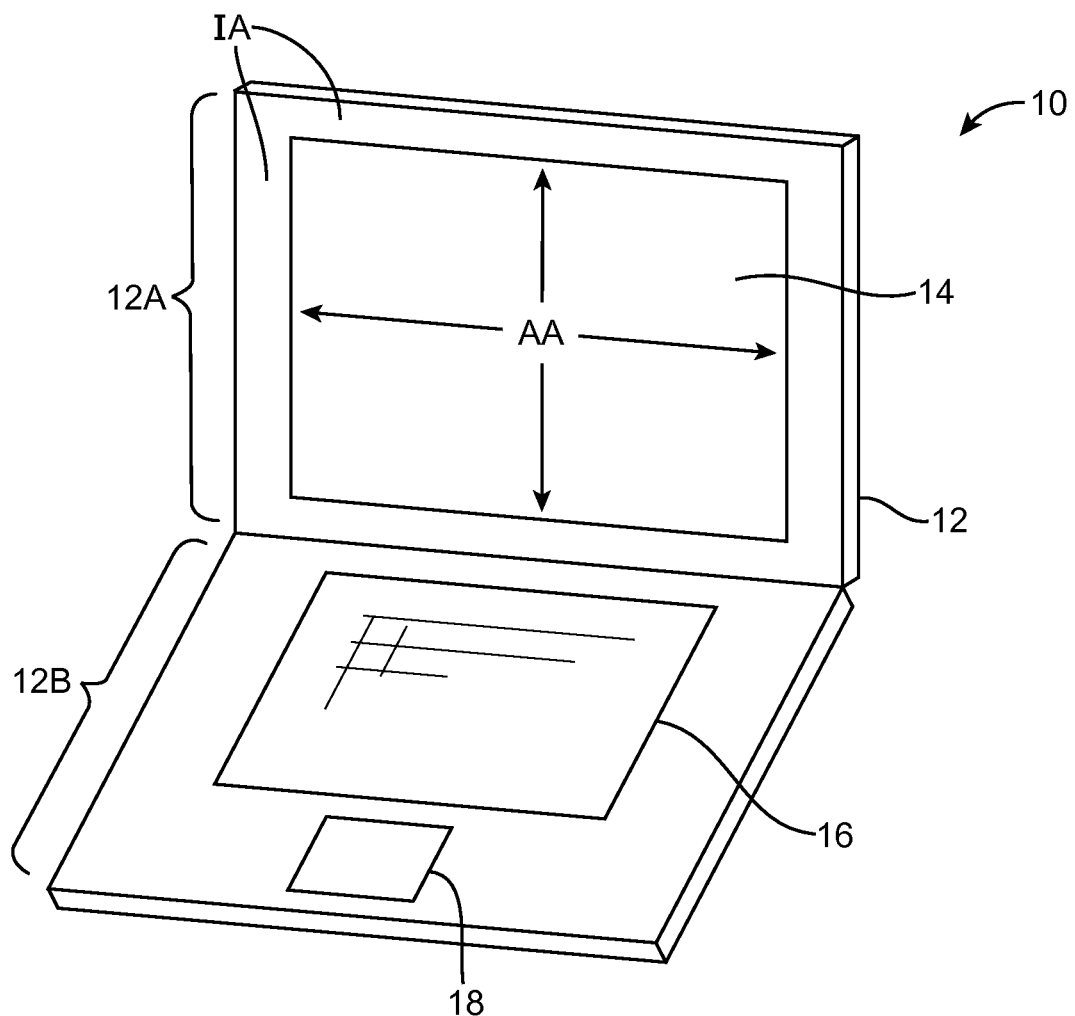
FIG. 1 is a perspective view of an illustrative electronic device such as a laptop computer with a display in accordance with an embodiment of the present invention.
Figure 2:
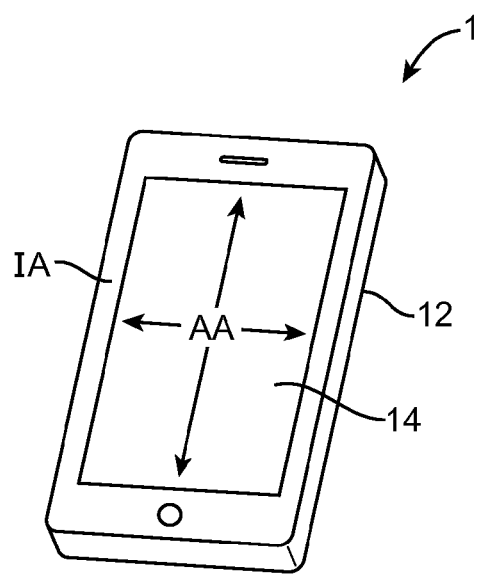
FIG. 2 is a perspective view of an illustrative electronic device such as a handheld electronic device with a display in accordance with an embodiment of the present invention.
Figure 3:
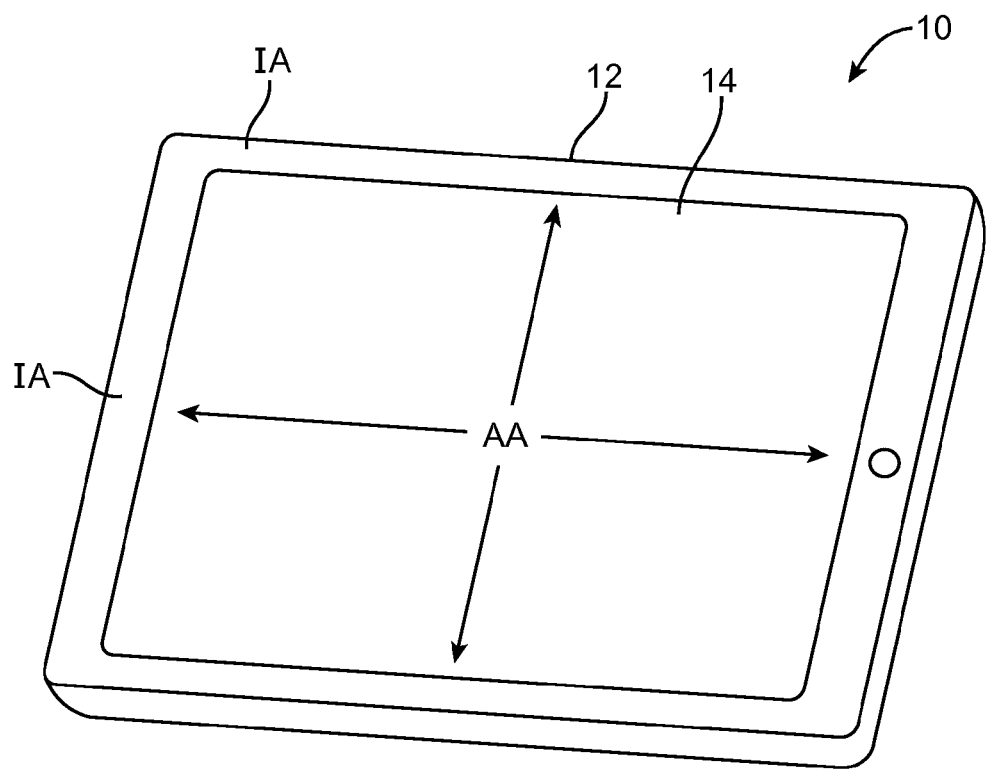
FIG. 3 is a perspective view of an illustrative electronic device such as a tablet computer with a display in accordance with an embodiment of the present invention.

Illustrative electronic devices that may be provided with displays are shown in FIGS. 1, 2, and 3. FIG. 1 shows how electronic device 10 may have the shape of a laptop computer having upper housing 12A and lower housing 12B with components such as keyboard 16 and touchpad 18. FIG. 2 shows how electronic device 10 may be a handheld device such as a cellular telephone, music player, gaming device, navigation unit, or other compact device. FIG. 3 shows how electronic device 10 may be a tablet computer. These are merely illustrative examples. Electronic devices such as illustrative electronic device 10 of FIGS. 1, 2, and 3 may be laptop computers, computer monitors with embedded computers, tablet computers, cellular telephones, media players, other handheld and portable electronic devices, smaller devices such as wristwatch devices, pendant devices, headphone and earpiece devices, other wearable and miniature devices, or other electronic equipment.

Device 10 may have a housing such as housing 12. Housing 12, which is sometimes referred to as a case, may be formed of materials such as plastic, glass, ceramics, carbon-fiber composites and other composites, metal, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may have one or more displays such as display 14. Display 14 may be an organic light-emitting diode (OLED) display or other suitable display. Display 14 may, if desired, include capacitive touch sensor electrodes for a capacitive touch sensor array or other touch sensor structures (i.e., display 14 may be a touch screen). Touch sensor electrodes may be provided on a touch panel layer that is interposed between organic light-emitting diode display structures and a transparent cover layer (e.g., a cover glass layer), may be formed on the underside of a cover layer, or may otherwise be incorporated into display 14.

As shown in FIGS. 1, 2, and 3, display 14 may be characterized by a central active region such as active region AA in which an array of display pixels is used in displaying information for a user. Active region AA may be surrounded by an inactive region such as inactive border region IA. Active region AA may have a rectangular shape. Inactive region IA may have a rectangular ring shape that surrounds active region AA (as an example). Portions of display 14 in inactive region IA may be covered with an opaque masking material such as a layer of black ink (e.g., a polymer filled with carbon black) or a layer of opaque metal. The opaque masking layer may help hide components in the interior of device 10 in inactive region IA from view by a user.

The organic light-emitting diode display structures (sometimes referred to as the OLED display structures, the OLED structures, the organic light-emitting diode structures, the organic light-emitting diode layer, the light-generating layers, the image-generating layers, the display layer, or the image pixel layer) may have a planar rectangular active region in its center that forms active area AA of display 14. The rectangular active region includes an array of light-emitting diode pixels. The edges of the organic light-emitting diode layer surround the active center region and form a rectangular peripheral ring. This border region contains circuitry such as signal lines and display driver circuitry that does not emit light and is therefore referred to as the inactive portion of the display. The inactive portion of the display is shown as inactive border region IA in FIGS. 1, 2, and 3.

To enhance device aesthetics, the width of inactive area IA that is visible from the front of the display may be minimized. Inactive area IA may be minimized by bending portions of the organic light-emitting diode layer downwards along the boundary between the active region and the inactive region.

The display may include neutral plane adjustment features in a bend region of the display that adjust the neutral plane of the bent portion of the display toward an outer surface of the bent portion, thereby minimizing the risk of damage to the bent portion during bending operations or during normal use of the display in a bent configuration. Bent edge portions of the display may help reduce the size of inactive area IA by allowing circuitry for operation the device (e.g., signal traces and driver circuitry) to be located behind the display.

The neutral plane adjustment features may include portions of the OLED structures in which at least some of one or more polymer layers have been removed, in which multiple polymer layers are provided with the ability to travel with respect to each other, in which an air gap is provided in a polymer layer, or may include other features that result in a neutral plane of the organic light-emitting diode display structures that is closer to a thin-film transistor layer of the display than in conventional displays. When this type of arrangement is used, the width of inactive border regions IA of devices 10 of FIGS. 1, 2, and 3 that is visible from the front of display 14 is minimized.

The minimal edge portion of display 14 that remains visible may be covered with a bezel or a portion of a display cover layer that is coated on its underside with an opaque masking layer such as black ink (as examples). A bezel may be formed, for example, from a stand-alone bezel structure that is mounted to housing 12, from a portion of housing 12 (e.g., a portion of the sidewalls of housing 12), or using other suitable structures.

Figure 4:
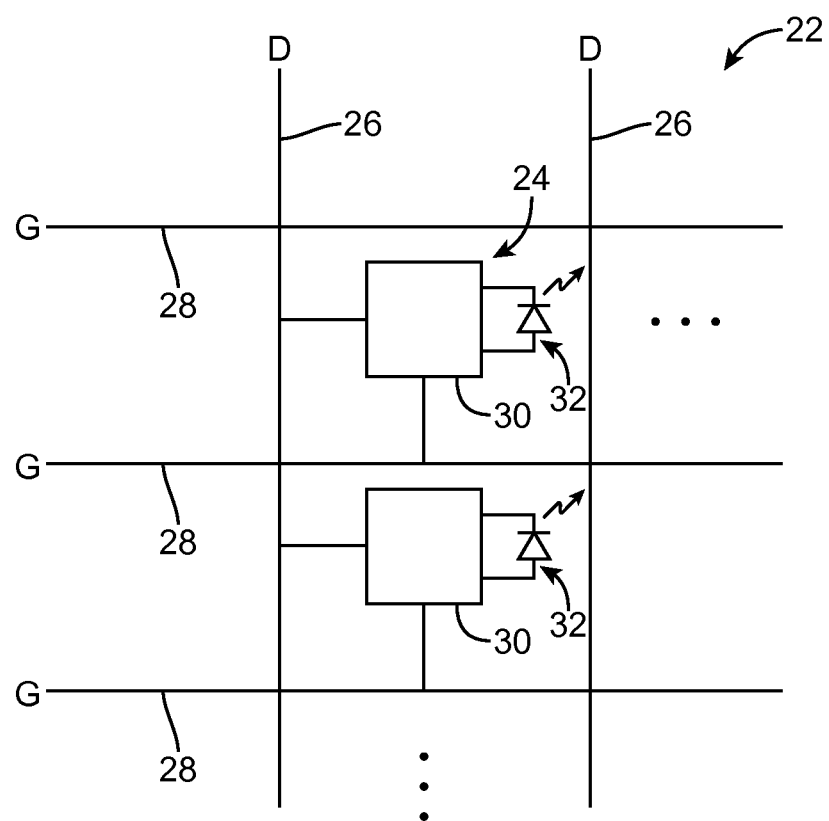
FIG. 4 is a circuit diagram of a portion of a pixel array on a display in accordance with an embodiment of the present invention.

A portion of the active region in display 14 is shown in FIG. 4. As shown in FIG. 4, the active region may include an array of light-emitting display pixels 24 such as array 22. Pixels 24 may be arranged in rows and columns in array 22 and may be controlled using a pattern of orthogonal control lines. The control lines in pixel array 22 may include gate lines 28 and data lines 26. There may be, for example, a pair of gate lines 28 interposed between each row of pixels 24 and a data line interposed between each column of image pixels.

Each pixel may include a light-emitting element such as organic light-emitting diode 32 and associated control circuitry 30. Control circuitry 30 may be coupled to the data lines and gate lines so that control signals may be received from driver circuitry. The driver circuitry may include on-display driver circuits such as gate line drivers implemented using low-temperature polysilicon transistors formed in the inactive portion of the display. The driver circuitry may also include a driver integrated circuit (e.g., a driver integrated circuit mounted in the inactive region or a driver integrated circuit mounted on an external printed circuit and coupled to pads in the inactive region using a cable such as a cable based on a flex circuit).

Figure 5:
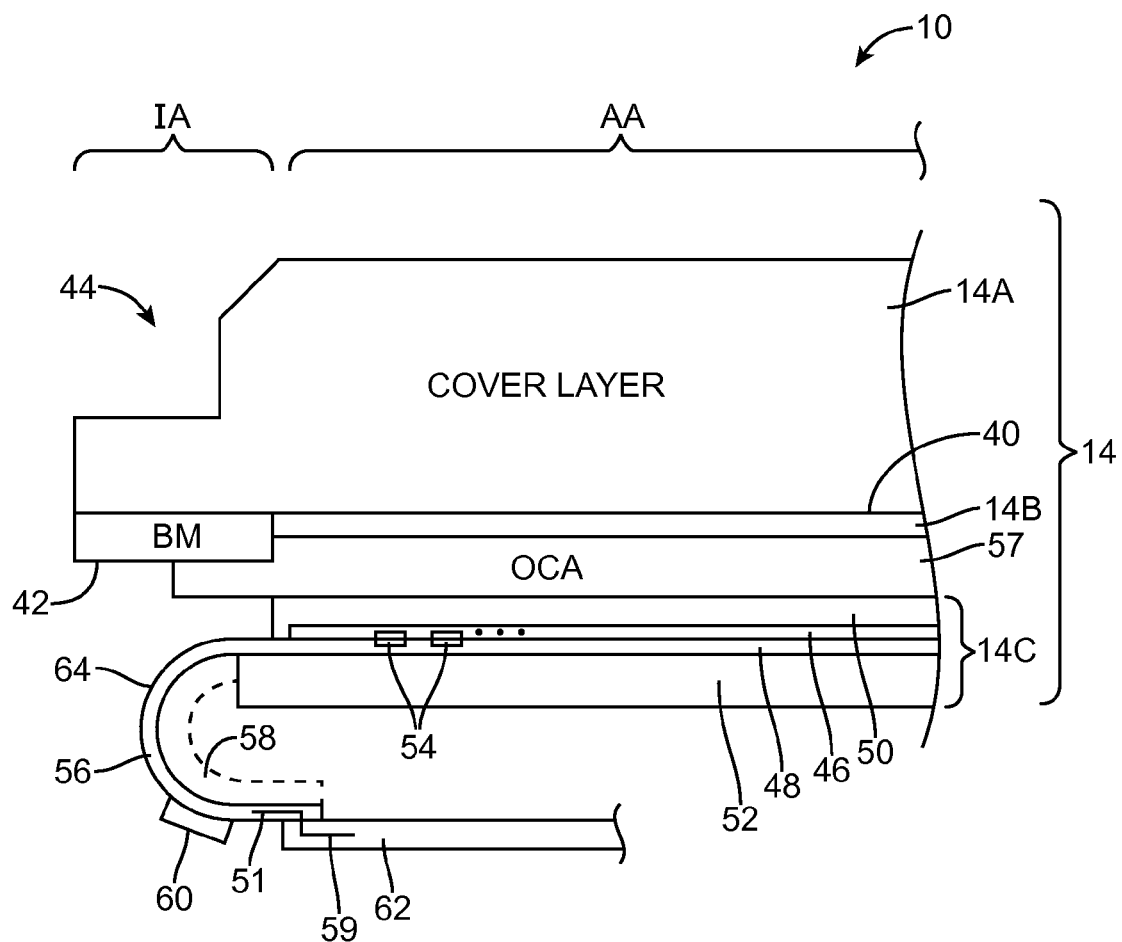
FIG. 5 is a cross-sectional view of a portion of an illustrative display with bent edge portions and neutral plane adjustment features in accordance with an embodiment of the present invention.

As shown in, for example, FIG. 5, display 14 may include a display cover layer such as cover layer 14A, a layer of touch-sensitive circuitry such as touch-sensor electrode layer 14B, and image-generating layers such as organic light-emitting diode display structures 14C.

Touch-sensitive layer 14B may incorporate capacitive touch electrodes. Touch-sensitive layer 14B may, in general, be configured to detect the location of one or more touches or near touches on touch-sensitive layer 14B based on capacitive, resistive, optical, acoustic, inductive, or mechanical measurements, or any phenomena that can be measured with respect to the occurrences of the one or more touches or near touches in proximity to touch-sensitive layer 14B. Touch-sensitive layer 14B may be formed from touch-sensor electrodes on inner surface 40 of cover layer 14A, touch-sensor electrodes on an additional substrate attached to surface 40, or may be otherwise incorporated into display 14.

Cover layer 14A may be formed from plastic or glass (sometimes referred to as display cover glass) and may be flexible or rigid. If desired, interior surface 40 of peripheral portions of cover layer 14A (e.g., in inactive area IA) may be provided with an opaque masking layer on such as black masking layer 42. Opaque masking layer 42 may be formed from black ink, metal, or other opaque materials. Cover layer 14A may be provided with one or more notches 44. Notch 44 may be configured to fit into a portion of housing 12 such as a sidewall portion.

As shown in FIG. 5, organic light-emitting diode structures 14C may include multiple layers such as a layer of organic emissive material 46, polymer layer 48 having thin-film transistor electrodes 54, encapsulation layer 50, and a protective carrier layer such as backfilm layer 52. Organic emissive material 46 may be formed over electrodes 54 on polymer layer 48. Encapsulation layer 50 may be formed over emissive material 46 thereby encapsulating the emissive material.

Organic emissive material 46 may be formed from organic plastics such as polyfluorene or other organic emissive materials. Encapsulation layer 50 may be formed from a layer of metal foil, metal foil covered with plastic, other metal structures, a glass layer, a thin-film encapsulation layer formed from a material such as silicon nitride, a layered stack of alternating polymer and ceramic materials, or other suitable material for encapsulating organic emissive material 46. Encapsulation layer 50 protects organic emissive material 46 from environmental exposure by preventing water and oxygen from reaching organic emissive materials within display 14.

Polymer layers 48 and 52 may each be formed from a thin plastic film formed from polyimide, polyethylene naphthalate (PEN), polyethylene terephthalate (PET), other suitable polymers, a combination of these polymers, etc. Other suitable substrates that may be used to form layer 48 include glass, metal foil covered with a dielectric, a multi-layer polymer stack, a thin glass film bonded to a thin polymer, a polymer composite film comprising a polymer material combined with nanoparticles or microparticles dispersed therein, etc. In one suitable arrangement that is sometimes described herein as an example, layer 48 is formed from a layer of polyimide and backfilm layer 52 is formed from polyethylene terephthalate. Polyimide layer 48 may have a thickness of 10-25 microns, 15-40 microns, 15-20 microns, or more than 5 microns. Backfilm layer 52 may have a thickness of 100-125 microns, 50-150 microns, 75-200 microns, less than 150 microns, or more than 100 microns. In one particular example, layer 48 may be 15-25 microns thick and backfilm layer 52 may be 100-125 microns thick.

As shown in FIG. 5, polyimide layer 48 may include a bent edge in bend region 56 that is bent away from the plane of display 14 in active area AA. Device 10 may include a display driver integrated circuit such as integrated circuit 60 mounted to layer 48 in region 56 of layer 48. Display driver integrated circuit 60 may receive display signals from additional circuitry in device 10 (e.g., a printed circuit board) through a connective circuit such as flexible printed circuit 62.

Conductive traces 51 of layer 48 may be coupled to conductive traces 59 in flexible printed circuit 62. Conductive traces 51 may be formed on surface 64 and/or embedded within layer 48.

Driver circuit 60 and flexible printed circuit 62 may be attached (e.g., using anisotropic conductive adhesive, solder, etc.) to surface 64 of layer 48 (e.g., the surface on which thin-film transistors 54 are formed) or may be attached to an opposing surface of layer 48. If desired, driver circuit 60 may be mounted on flexible printed circuit 62 instead of layer 48.

Organic light-emitting diode structures 14C may be attached to cover layer 14A (e.g., a cover glass layer having touch-sensor electrodes 14B attached to interior surface 40 of the cover layer) using adhesive such as optically clear adhesive (OCA) 57.

As shown in FIG. 5, organic light-emitting diode layers 14C may include neutral plane adjustment features 58. Neutral plane adjustment features 58 may be structures or other features of layer 52 that help move the neutral plane of layers 14C relatively closer to surface 64, thereby reducing bending stresses associate with the bend in layers 14C in bend region 56. Features 58 may include removed portions of layer 52, thinned portions of layer 52, multi-layered slip portions of layer 52, and/or air gaps in layer 52 as shown respectively in FIGS. 6, 7, 8, and 9.

Figure 6:
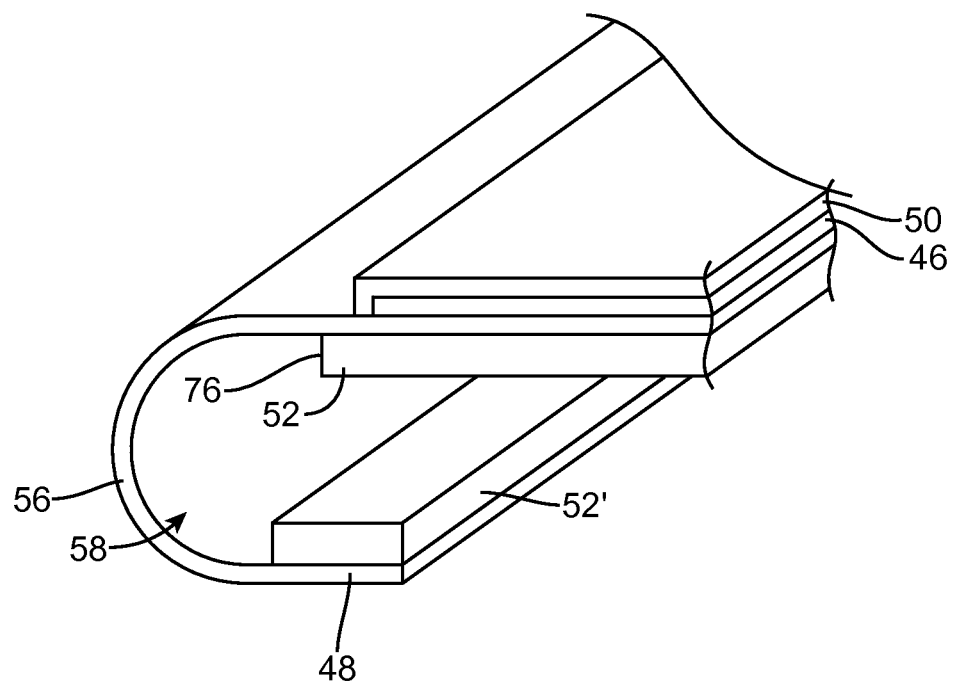
FIG. 6 is a perspective view of a portion of an illustrative display showing how neutral plane adjustment features may include portions of the display in a bend region in which a backfilm layer has been removed in accordance with an embodiment of the present invention.

In the example of FIG. 6, feature 58 is formed from a gap in backfilm layer 52 in which a portion of backfilm 52 has been removed so that display 14 is free of backfilm material 52 in bend region 56. In this type of configuration, backfilm 52 may include a portion 52' formed along an end of layer 48 beyond bend region 56. However, this is merely illustrative. If desired, layer 52 may be cut at edge 76 and substantially all of layer 52 that is outward of edge 76 may be removed from polyimide layer 48. Backfilm 52 may be cut prior to attachment to polyimide layer 48 (e.g., pre-cut) or backfilm 52 may be attached to layer 48 and then cut while attached to layer 48.

Figure 7:
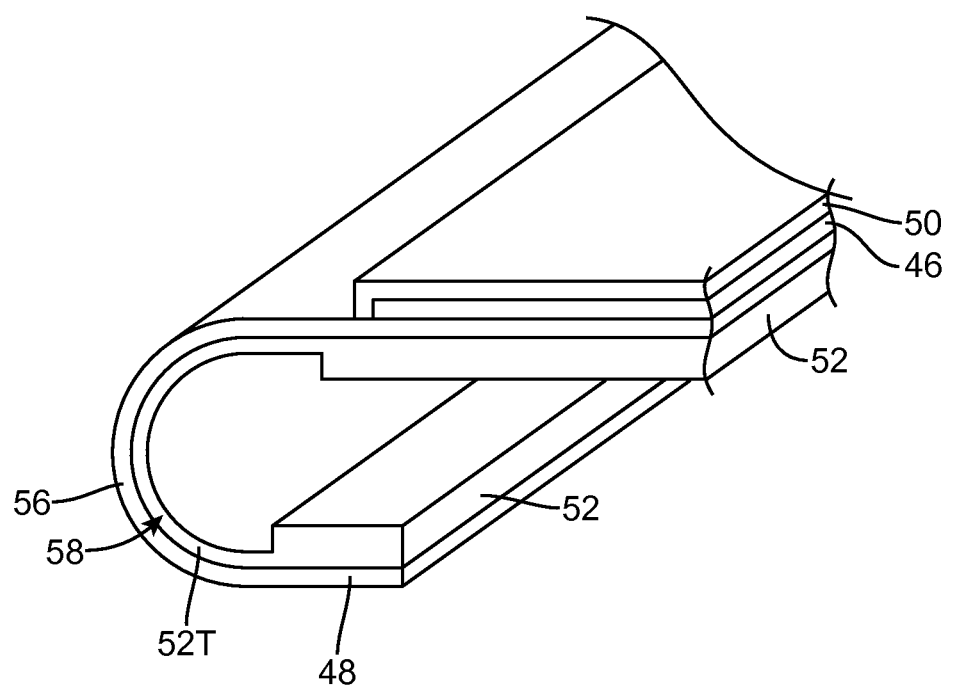
FIG. 7 is a perspective view of a portion of an illustrative display showing how neutral plane adjustment features may include thinned portions of a backfilm layer in accordance with an embodiment of the present invention.

In the example of FIG. 7, a thinned portion of backfilm 52 remains attached to layer 48 in bend region 56. Thinned portion 52T may have a thickness that is smaller than the thickness of backfilm 52 in active area AA of display 14.

Figure 8:
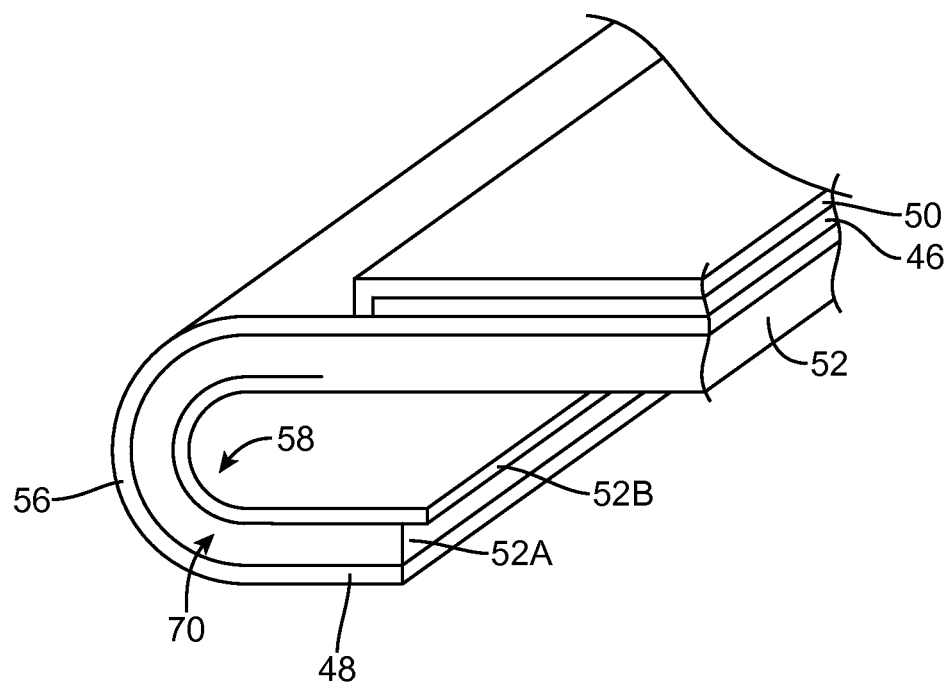
FIG. 8 is a perspective view of a portion of an illustrative display showing how neutral plane adjustment features may include a multilayer backfilm that includes layers that are free to travel with respect to other layers in a bend region in accordance with an embodiment of the present invention.

In the example of FIG. 8, feature 58 is formed from a portion of backfilm 52 that includes multiple sublayers of polymer material such as layer 52A and layer 52B in bend region 56. Layers 52A and 52B may be formed form a common material or may be formed from different materials. Layers 52A and 52B may form an interfacing region such as interface 70. Layers 52A and 52B may be provided with the ability to travel at interface 70 so that, for example, layer 52B extends beyond an edge of layer 52A in a bent configuration of the type shown in FIG. 8. Interface 70 may be a planar interface, a scalloped interface, or may have other surface features that help reduce bending stresses in layers 14C. Some or all of layer 52B may be attached to layer 48.

Figure 9:
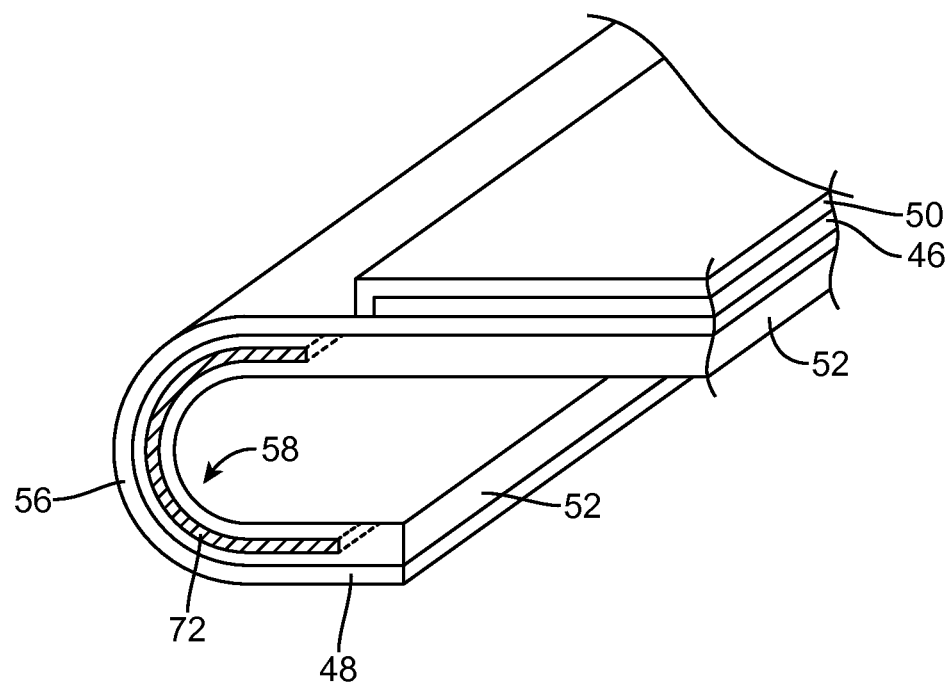
FIG. 9 is a perspective view of a portion of an illustrative display showing how neutral plane adjustment features may include an air gap in a backfilm layer in accordance with an embodiment of the present invention.

In the example of FIG. 9, feature 58 is formed from air gap 72 in backfilm 52 in bend region 56. In each of the examples of FIGS. 6, 7, 8, and 9, features 58 facilitate the bending of layers 14C by reducing the risk of damage to layers 14C in bend region 56.

Figure 10:
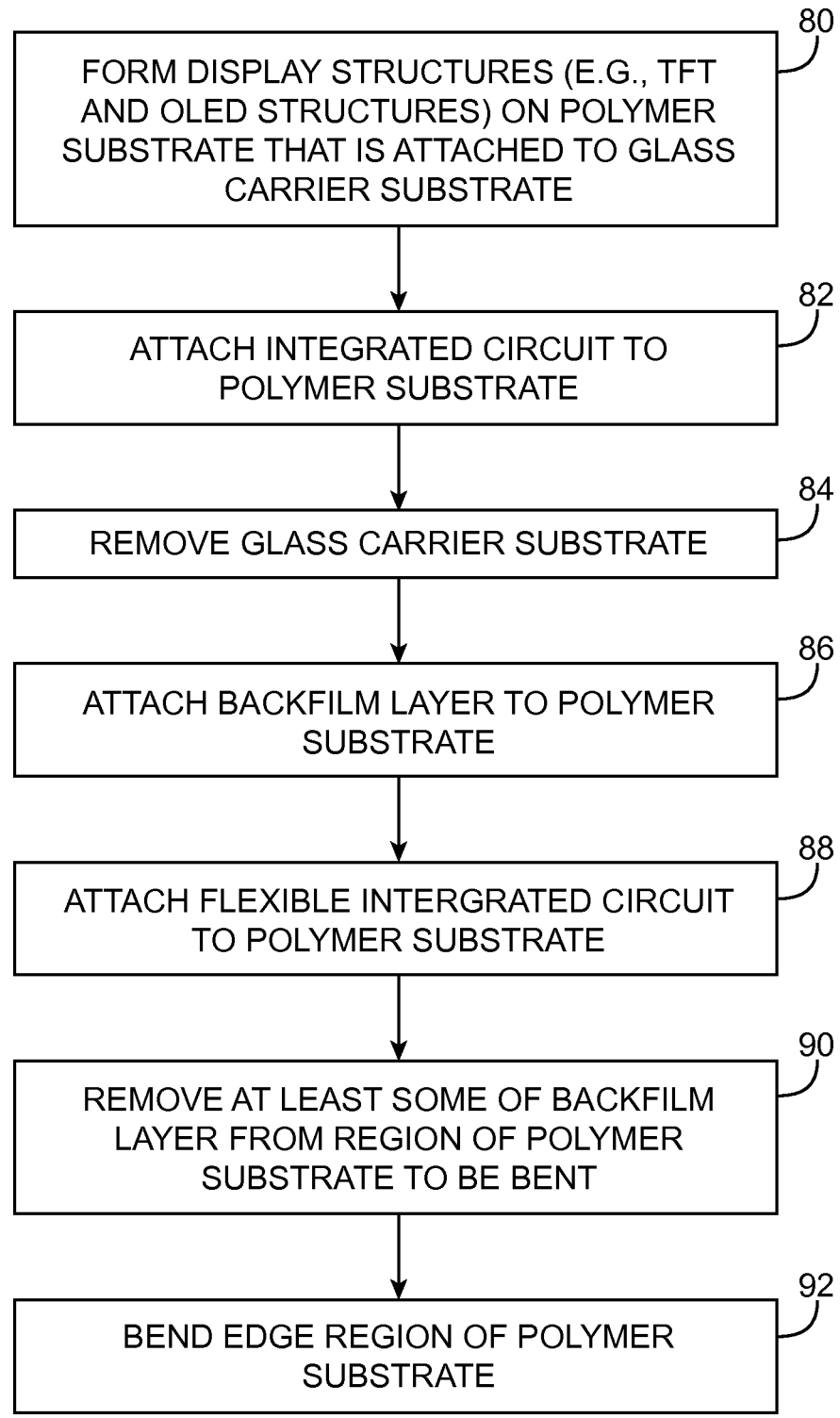
FIG. 10 is a flow chart of illustrative steps involved forming a display with bent edges and neutral plane adjustment features by removing a portion of a backfilm layer during display assembly operations in accordance with an embodiment of the present invention.
Figure 11:
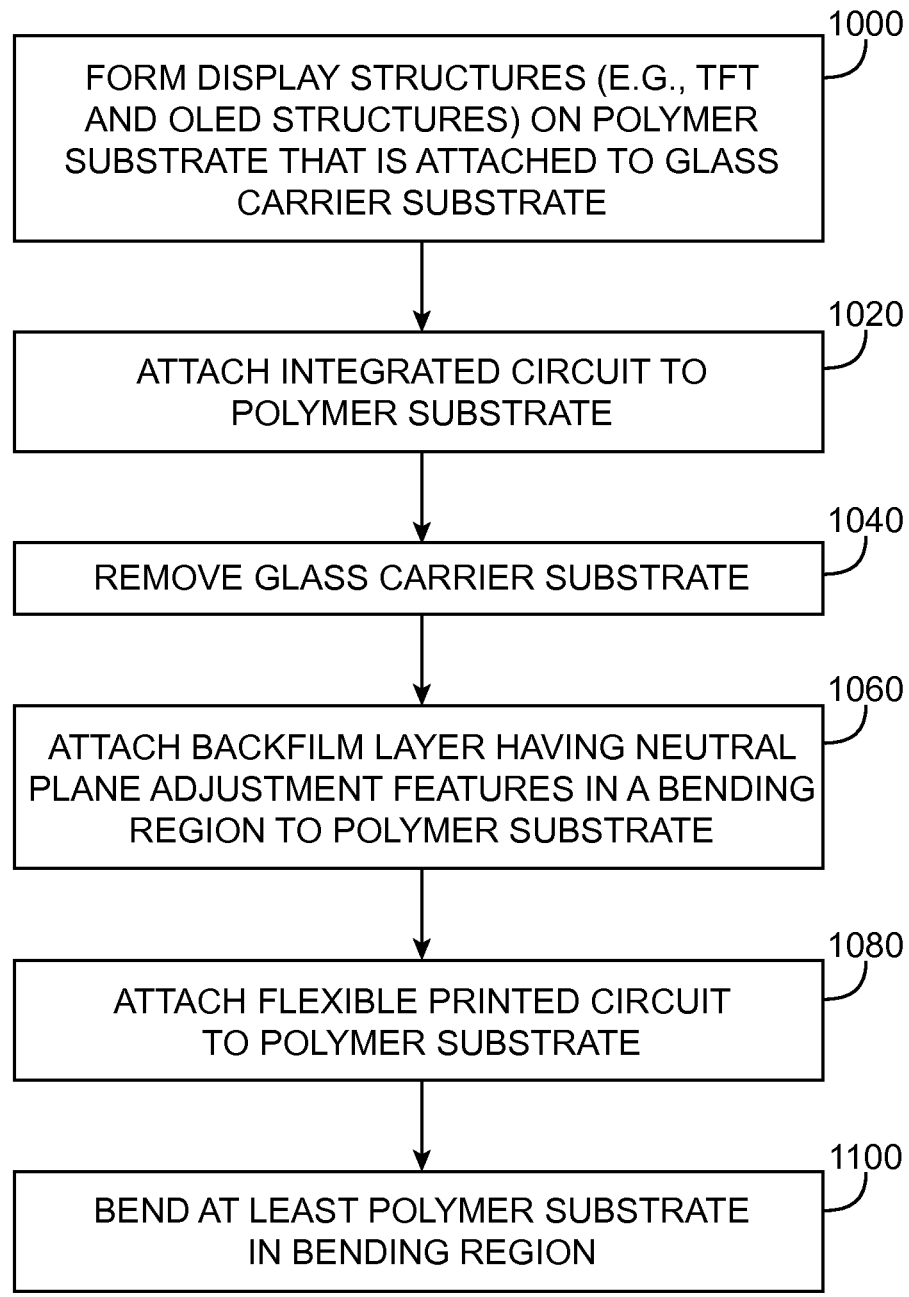
FIG. 11 is a flow chart of illustrative steps involved forming a display with bent edges and neutral plane adjustment features using a pre-cut backfilm layer in accordance with an embodiment of the present invention.

As described above in connection with FIG. 5, features 58 in backfilm 52 may be formed after or before backfilm 52 is attached to polyimide layer 48. FIGS. 10 and 11 are flowcharts of illustrative steps that may be involved in forming features 58 in backfilm 52 respectively after and before attaching backfilm 52 to layer 48.

In the example of FIG. 10, features 58 are formed after attaching backfilm 52 to layer 48.

At step 80, display structures such as thin-film transistor structures and other organic light-emitting diode structures may be formed on a polymer substrate such as polyimide layer 48 that is attached to a glass carrier substrate.

At step 82, an integrated circuit such as display driver integrated circuit 60 may be attached to the polymer substrate.

At step 84, the glass carrier may be removed (e.g., delaminated) from the polymer substrate.

At step 86, a polymer carrier layer such as backfilm layer 52 may be attached to the polymer substrate.

At step 88, a flexible printed circuit such as flexible printed circuit 62 of FIG. 5 may be attached to the polymer substrate.

At step 90, at least some of the backfilm layer may be removed (e.g., cut, peeled, or otherwise removed) from the polymer substrate in a region that is to be bent in an assembled electronic device.

At step 92, an edge region of the polymer substrate may be bent into, for example, the bent configuration described above in connection with FIG. 5.

In the example of FIG. 11, features 58 are formed in backfilm 52 before attaching backfilm 52 to layer 48.

At step 1000, display structures such as thin-film transistor structures and other organic light-emitting diode structures may be formed on a polymer substrate such as polyimide layer 48 that is attached to a glass carrier substrate.

At step 1020, an integrated circuit such as display driver integrated circuit 60 may be attached to the polymer substrate.

At step 1040, the glass carrier may be removed (e.g., delaminated) from the polymer substrate.

At step 1060, a polymer carrier layer having neutral plane adjustment features (e.g., openings, thinned portions, gaps, air gaps, or traveling layers in a bending region) may be attached to the polymer substrate.

At step 1080, a flexible printed circuit such as flexible printed circuit 62 of FIG. 5 may be attached to the polymer substrate.

At step 1100, a bending (edge) region of at least the polymer substrate may be bent into, for example, the bent configuration described above in connection with FIG. 5.

Figure 12:
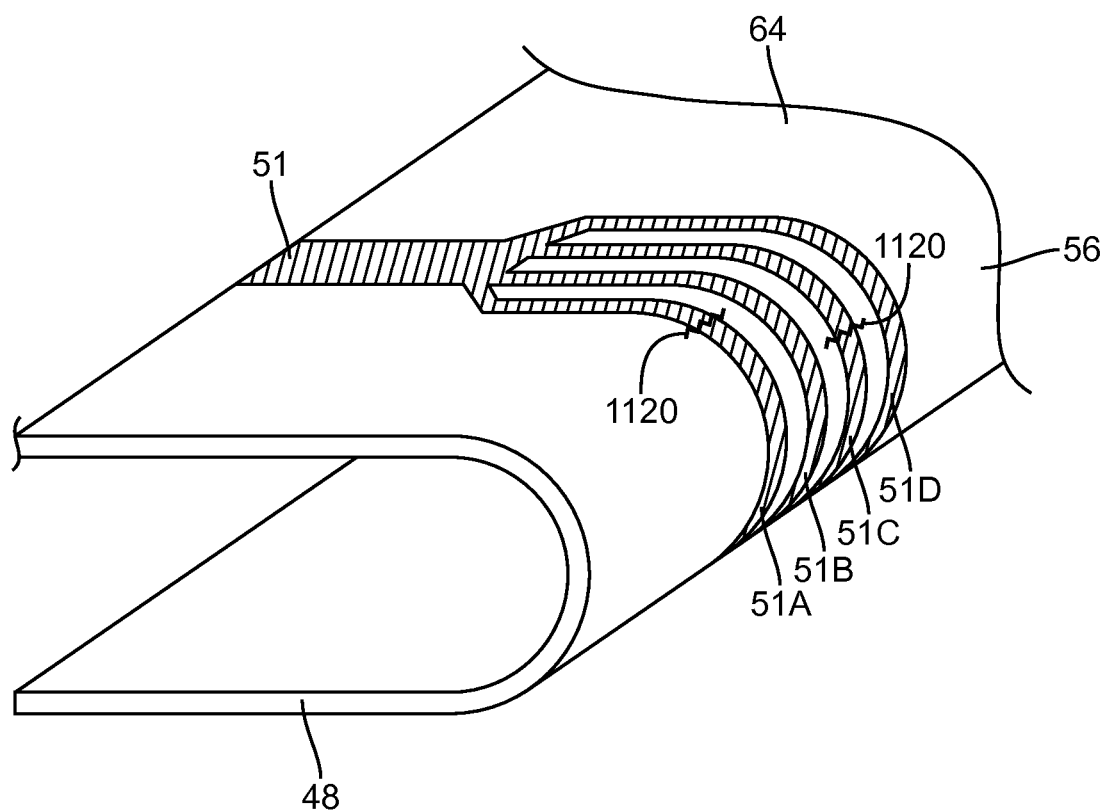
FIG. 12 is a perspective view of a portion of an illustrative display polymer layer showing how conductive traces on the polymer layer may be split into multiple conductive sub-traces in a bend region of the display in accordance with an embodiment of the present invention.

In order to prevent severed electrical connections in bend region 56, conductive traces in the bend region may be split into multiple traces as shown in FIG. 12. In this way, if one or more of the split traces breaks during bending, one or more unbroken traces may remain intact so that display signals may be transmitted to display pixels in active regions of the display. In the example of FIG. 12, conductive traces such as traces 51 on surface 64 each split into four sub-traces such as traces 51A, 51B, 51C, and 51D in bend region 56. Traces 51A, 51B, 51C, and 51D may converge into a single trace 51 on both sides of bending region 56. As shown in FIG. 12, one or more traces such as traces 51A and 51C may suffer breaks 1120 due to the bending of layer 48. However, other traces such as traces 51B and 51D that are unbroken may be sufficient to carry display signals along the bend region.

Figure 13:
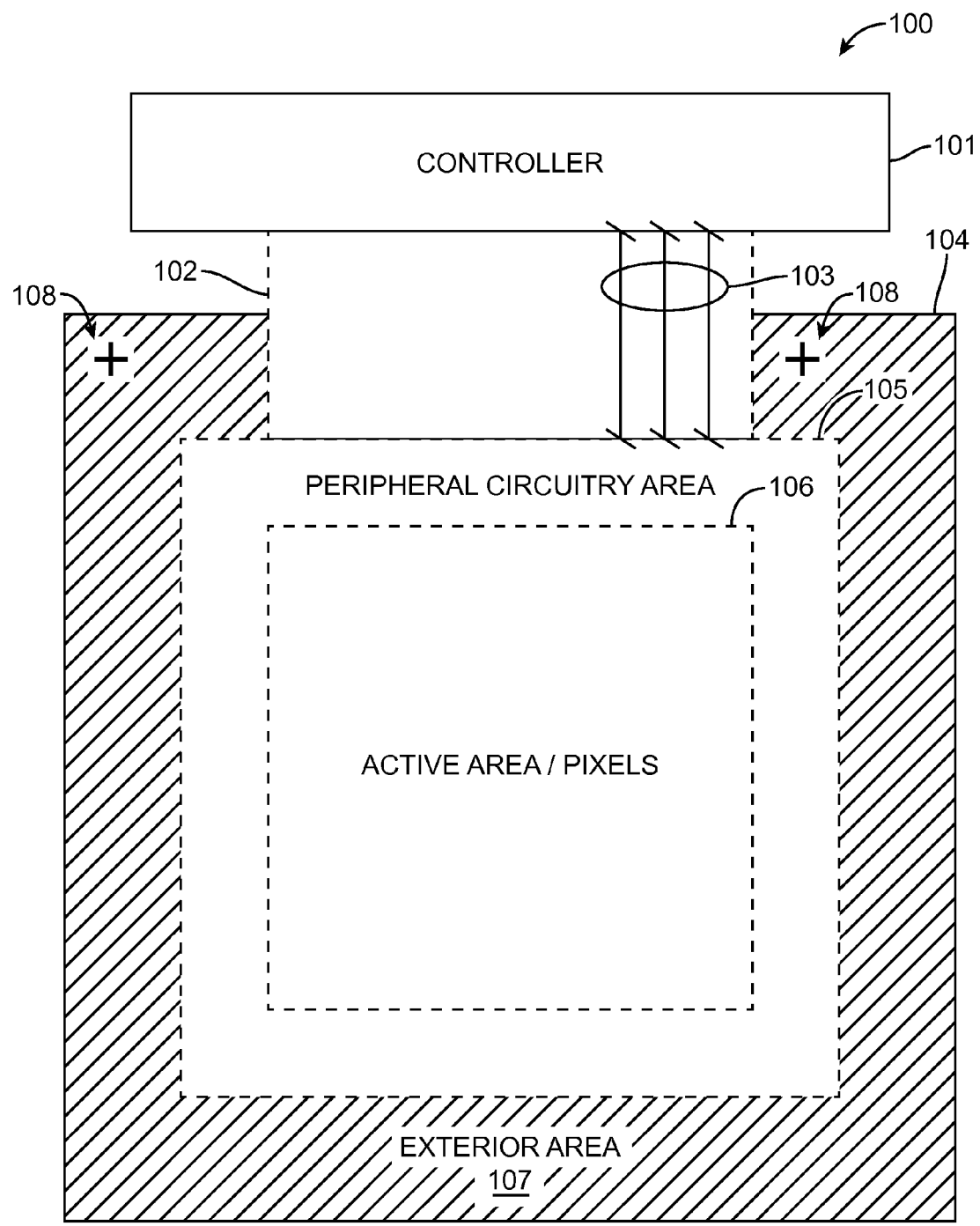
FIG. 13 is a schematic top view of a display device, in accordance with an embodiment of the present invention.

Turning to FIG. 13, a schematic top view of a display device 100 (e.g., a display device such as display 14 of FIG. 1, 2, 3, or 5) is illustrated. In FIG. 13, an active area (e.g., active area AA of FIG. 1, 2, 3, or 5) or pixel portion 106 and peripheral circuitry area 105 are provided over a substrate 104. Exterior area 107 is also provided over substrate 104, and may include one or more electrodes 103 for communication with peripheral circuitry 105. Electrodes 103 may be arranged to communicate with controller 101 over interconnections 102, which may be a flexible interconnection or connector.

The substrate 104 may include a plurality of optical fiduciary markers or fiducials 108. The fiducials 108 may facilitate alignment and bending operations as described herein. For example, the fiducials 108 may facilitate alignment of a clamping member disposed to engage, clamp, and bend a portion of the periphery of the substrate 104 substantially orthogonal to the active area 106 to reduce an apparent surface area of the display device from a vantage point facing the device 100. For example, the peripheral portion may include the exterior area 107 being bent orthogonal to the active area 106 in one embodiment. For example, the peripheral portion may include a portion of the peripheral circuitry area 105 bent orthogonal to the active area 106 in one embodiment.

As used hereinafter, the active area 106 may also be termed a display panel, and/or may include a plurality of display pixels disposed to be driven/controlled by peripheral circuitry 105. The display panel 106 may include electrical components designed to deliver electrical signals to display pixels, any material that provides electro-optical response in response to these signals, and optionally additional optical or electrical materials to enhance the functionality of the display panel 106. The plurality of display pixels may include light-emitting diodes. The plurality of light-emitting diodes may include organic thin-film light-emitting diodes, polymer-based light-emitting diodes, nanoparticle-based light emitting diodes, discreet inorganic light-emitting diodes, or any other suitable light-emitting diodes configured to actively emit light based on signals generated with gate control circuitry 105. The plurality of display pixels may also include liquid-crystal light-shuttering type devices and have one or more backlights arranged to transmit light through the light-shuttering type devices.

Although particularly illustrated as encompassing an outer area proximate a periphery of the active area 106, it should be understood that additional peripheral circuitry may populate any desired portion of the display device 100, including areas underlying or coplanar with the active area 106 and/or exterior area 107.

Figure 14:
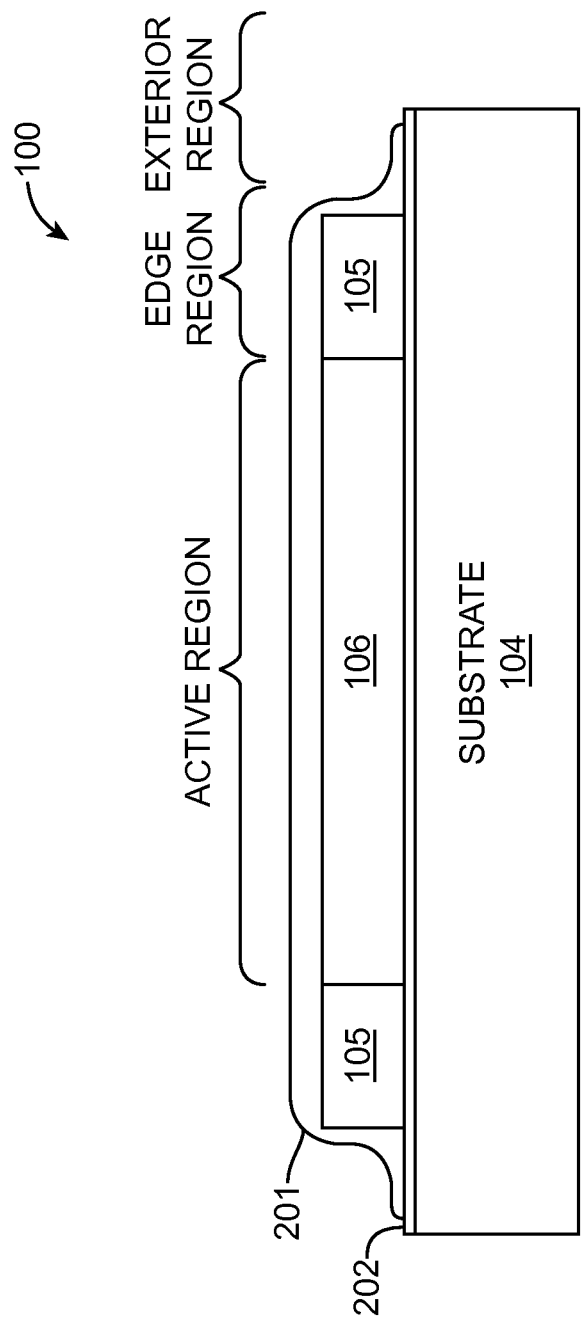
FIG. 14 is a cross sectional view of a display device, in accordance with an embodiment of the present invention.

Turning to FIG. 14, a cross sectional view of a display device 100 is illustrated. The substrate 104 may include a backplane 202 arranged thereon and supporting the display panel 106 and peripheral circuitry 105. The backplane 202 may comprise electrical interconnections configured to carry electric signals about the substrate 104, for example, electrodes 103 or a portion thereof.

As further shown, the display device 100 includes an encapsulation layer 201 arranged on the display panel 106, the peripheral circuitry 105, and the backplane 202. The encapsulation layer 201 may be configured to protect the display device 100, for example, by limiting the transfer of oxygen and moisture to sensitive components including display pixels, peripheral circuitry components, and/or electrical interconnections. The encapsulation layer 201 may be a multi-layered encapsulation means comprising one or more layered forms of organic and inorganic films to further protect the display device 100. For example, according to one exemplary embodiment, the encapsulation layer 201 is a multilayer dyad barrier. According to other exemplary embodiments, the encapsulation layer 201 is an arrangement of alternating hard and soft polymer films. According to further exemplary embodiments, the encapsulation layer 201 is a single layer of a functionalized organic, inorganic, or hybrid material. According to still further exemplary embodiments, the encapsulation layer 201 comprises a metal film or foil.

As further shown in FIG. 14, an active region is generally defined as a region comprising the display panel 106 which may include a plurality of display pixels. An edge region is generally defined as a region comprising peripheral circuitry 105 and areas proximate thereto. An exterior region is generally defined as a region comprising a portion of exterior area 107 and areas proximate thereto. However, various modifications are also applicable to these terms, and various modifications to the particular structures and regions illustrated may also be applicable. For example, the edge region may also be defined as a region comprising the encapsulation layer 201 outside of the active region. Therefore, the edge region may or may not comprise peripheral circuitry. Likewise, the exterior region may or may not comprise peripheral circuitry. All such modifications to these terms and illustrations should be interpreted to be within the scope of exemplary embodiments of the invention.

Hereinafter, methods of forming display devices with reduced border regions are described in detail.

Figure 15A:
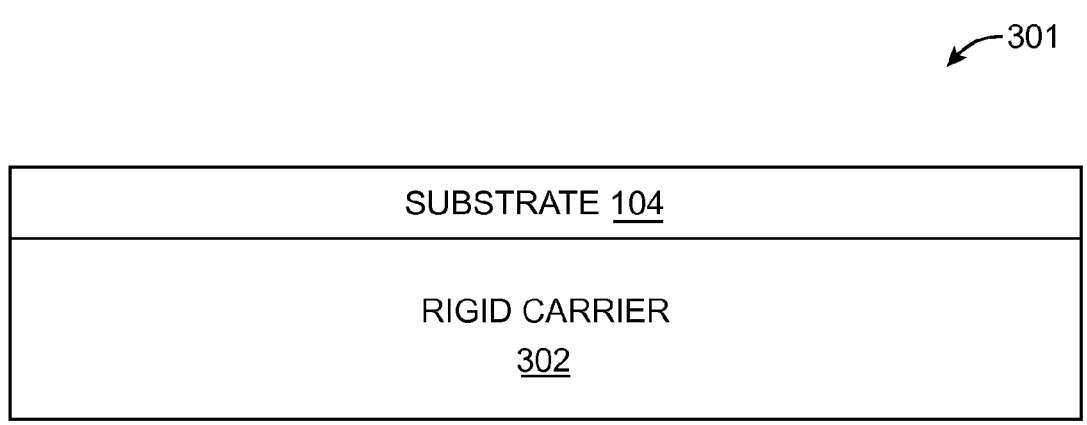
FIGS. 15A-15I illustrate portions of a method of forming a display device, in accordance with an embodiment of the present invention.

FIGS. 15A-15I illustrate portions of a method of forming a display device, according to exemplary embodiments of the present invention. Turning to FIG. 15A, a substrate 104 may be formed on a rigid carrier 302 at a first process step 301. The rigid carrier 302 may be a plate glass carrier and may be termed a rigid substrate. The substrate 104 may be any suitable substrate, including a flexible substrate capable of supporting an electronic backplane layer, a display panel layer, and peripheral circuitry components. The substrate 104 may be a polyimide substrate in one exemplary embodiment. The substrate 104 may comprise a metal foil coated with or bonded to a dielectric layer in a further exemplary embodiment.

Figure 15B:
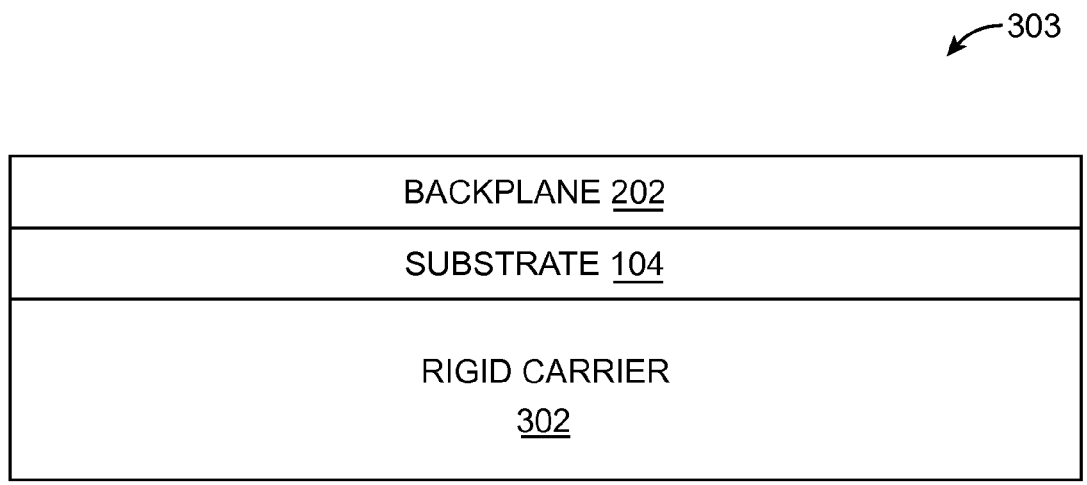

Turning to FIG. 15B, a backplane 202 may be formed on the substrate 104 in a process step 303. The backplane 202 may be patterned with a plurality of device interconnections, power supply lines, ground and signal lines, and/or any other suitable components.

Figure 15C:
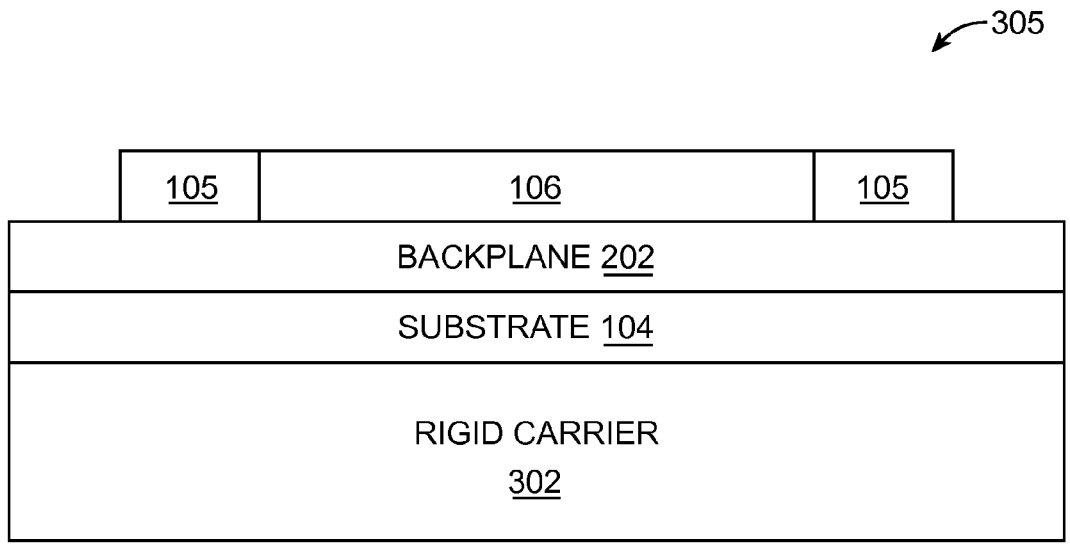

Turning to FIG. 15C, peripheral circuitry 105 and display panel 106 may be formed on the backplane 202 in a process step 305. The peripheral circuitry 105 and display panel 106 may be formed with any suitable process, and may include organic thin film devices and/or organic light emitting devices.

Figure 15D:
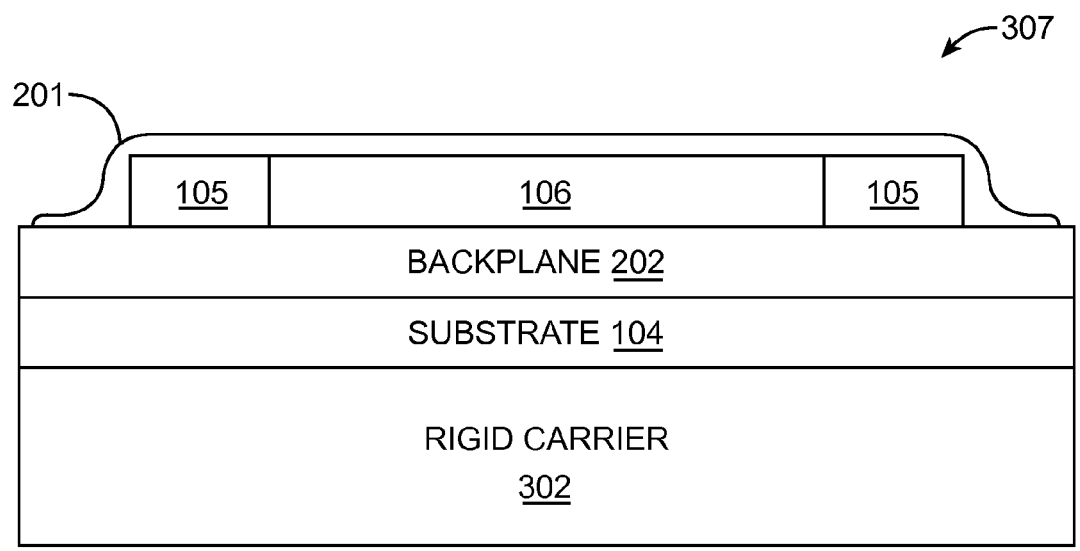

Turning to FIG. 15D, an encapsulation layer 201 may be formed over the backplane 202, the peripheral circuitry 105, and the display panel 106 in a process step 307. The encapsulation layer 201 may take any of the protective forms described above, or any other suitable form including a single layer of protective film adhered to associated portions of the display device 100.

Figure 15E:
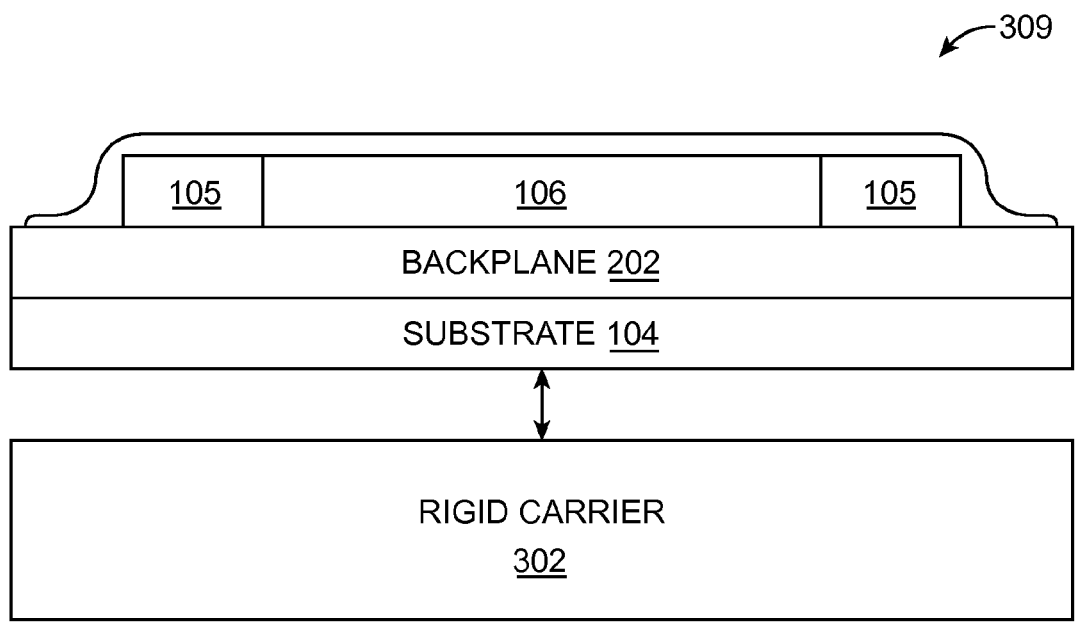

Turning to FIG. 15E, the rigid carrier 302 may be separated from the substrate 104 in a process step 309. The separation may be facilitated by mechanical or chemical separation, or any combination thereof. For example, the substrate 104 may be delaminated from the carrier 302 using a series of chemistries configured to loosen or detach an adhesive bond therebetween. Additionally, or alternatively, the substrate 104 may be lifted or peeled away from the carrier 302. Any other suitable means for separation may also be appropriate.

Figure 15F:
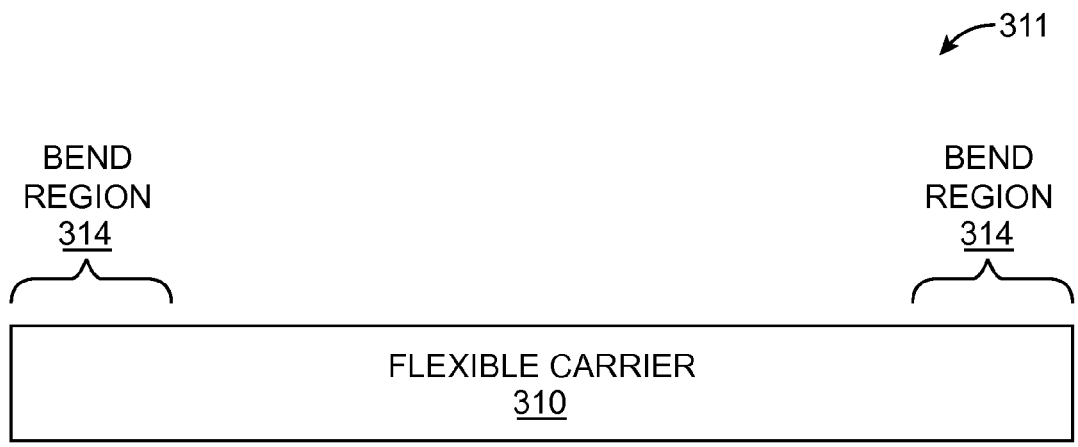

Turning to FIG. 15F, a flexible carrier or substrate 310 may be prepared at a process step 311. One or more bend or fold regions 314 may also be identified, for example, through use of optical markings, fiducials, measurement, placement in a mechanical jig of clamp, or any other suitable means for identification.

Figure 15G:
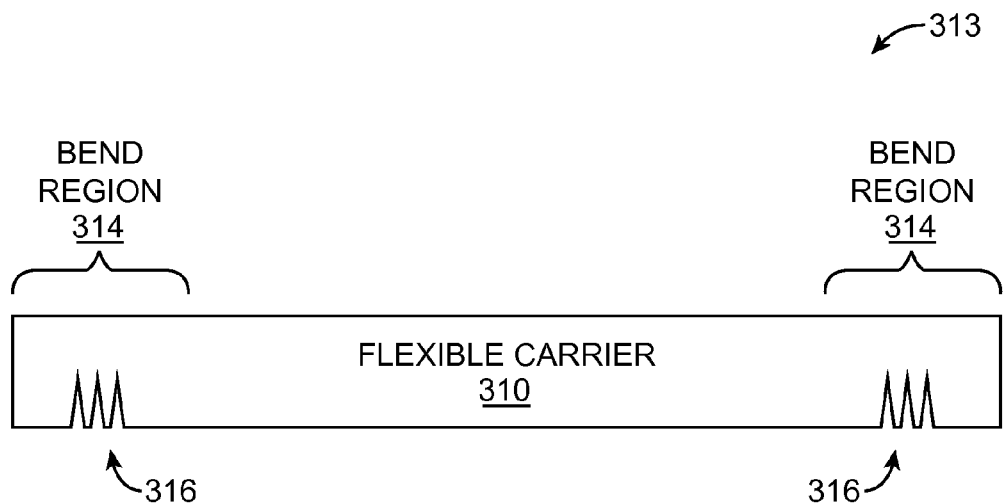

Turning to FIG. 15G, a series of trenches 316 may be formed in the flexible carrier 310 near or within the identified bend regions 314 at a process step 313. As illustrated, the trenches 316 may be shaped as generally triangular such that mechanical stresses from bending may be reduced. According to some exemplary embodiments, the trenches 316 may be omitted in their entirety or may be altered from the forms shown, for example, through formation of more or less trenches, trenches of differing cross-sections or shapes than those shown, or through other means of relieving mechanical stresses associated with bending at one or more bend regions 314.

Figure 15H:
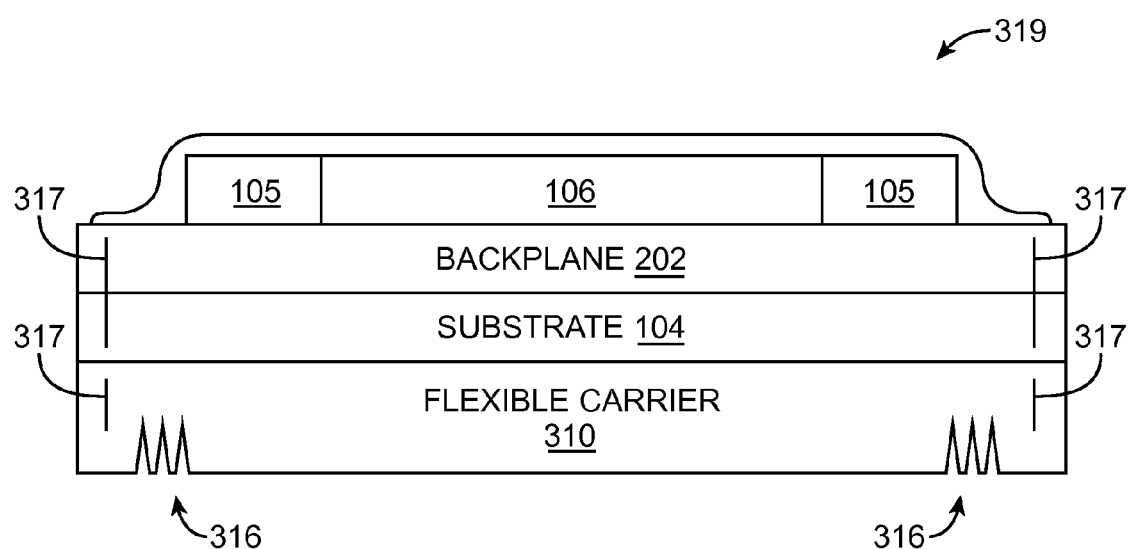

Turning to FIG. 15H, the flexible carrier 310 may be aligned and adhered to the substrate 104 at a process step 319. Alignment may be facilitated through optical markers or fiducials 317 or by other means. Adhering may be facilitated through heat treatment, adhesive chemistries, glues, mechanical fasteners, or by any other suitable means for adhering.

Figure 15I:
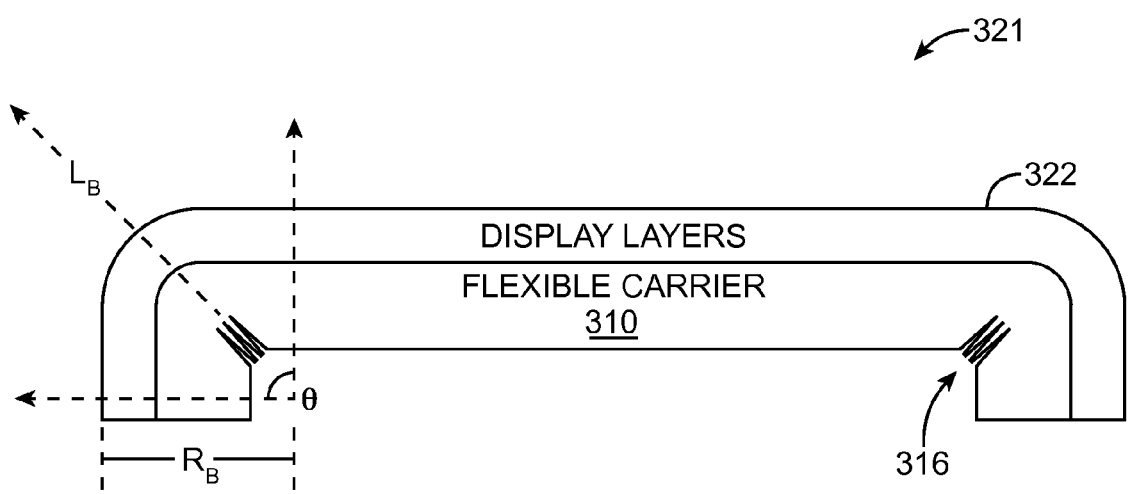

Turning to FIG. 15I, the flexible carrier 310 and supported display layers 322 may be bent at a process step 321 such that a portion of the periphery of the display layers and flexible carrier are bent substantially orthogonal to display panel 106 (not illustrated for clarity of discussion). For example, display layers 322 may include any or all of the peripheral circuitry 105, display panel 106, encapsulation layer 201, backplane 202, and any other associated display components.

As illustrated, the trenches 316 compress about each bend relieving a portion of the mechanical stresses introduced during process step 321. Alternatively, trenches 316 may be omitted.

As also illustrated, each bend or fold includes bend radius RB about a bend angle θ along a bending line LB. The bend radius RB may be less than 1 mm in some exemplary embodiments. The bend radius RB may be between about 0.2 mm-1 mm in some exemplary embodiments. The bend angle θ may be about 90° in some exemplary embodiments. The bend angle θ may be between about 80°-90° in some exemplary embodiments.

Figure 16A:
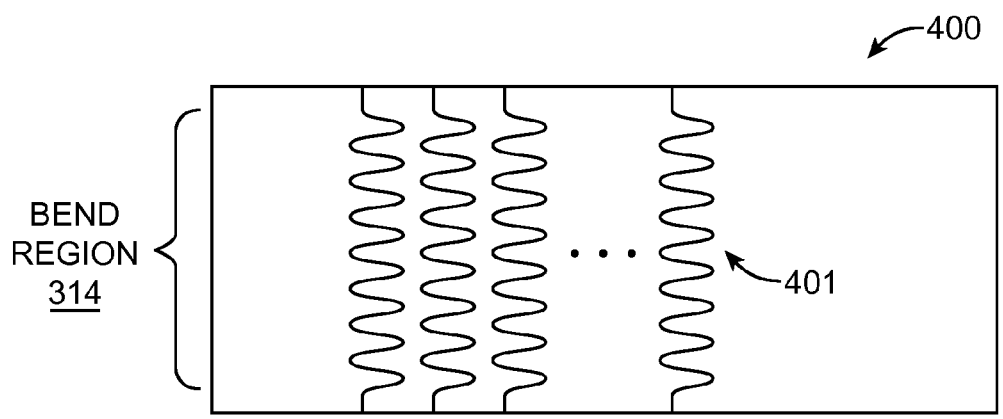
FIGS. 16A-16C illustrate forms of alternate electrical interconnection arrangements for display devices, in accordance with an embodiment of the present invention.
Figure 16B:
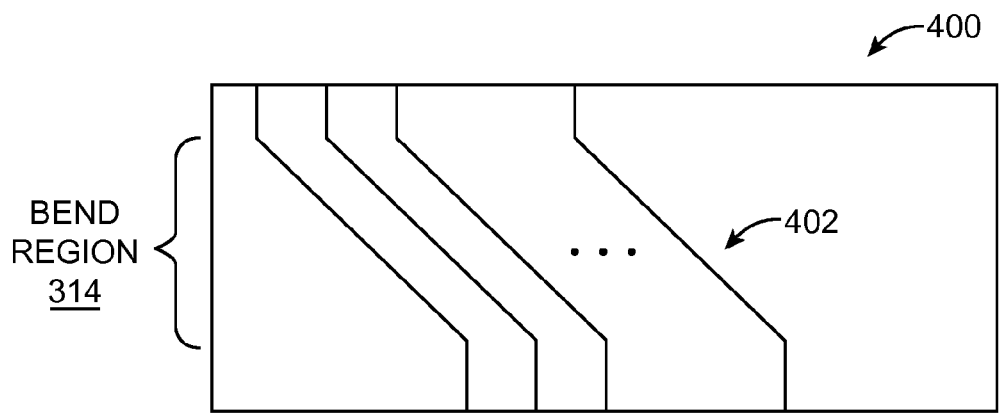
Figure 16C:
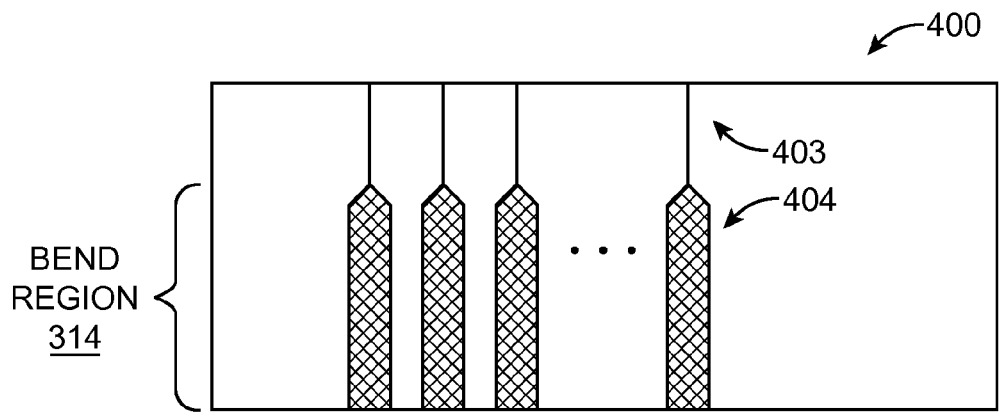

As discussed above, at least one electrode configured to transmit signals to, from, and/or between peripheral circuitry 105 may populate bent areas within bend regions 314. FIGS. 16A-16C illustrate forms of alternate electrical interconnection arrangements within bend or fold regions of display devices, according to exemplary embodiments of the present invention.

Turning to FIG. 16A, electrodes 401 of a region 400 to be bent may be arranged in a waving, sinusoidal, alternating, or disruptive planar pattern to reduce probability of significant severance of electrical conductivity.

Turning to FIG. 16B, electrodes 402 of a region 400 to be bent may be arranged to traverse a bend region 314 at an angle to reduce probability of significant severance of electrical conductivity.

Turning to FIG. 16C, electrodes 403 of a region 400 to be bent may include a second bend portion 404 formed of a second conductor to reduce probability of significant severance of electrical conductivity. The second conductor may be formed of conductive ink, copper, aluminum, or other flexible conductors. The second bend portion may have an increased surface area to promote good electrical conductivity even across orthogonal bends. The second bend portion 404 may also be a laminated conductor formation of several thin films of conductor to promote stretching with reduced breakage.

Figure 17:
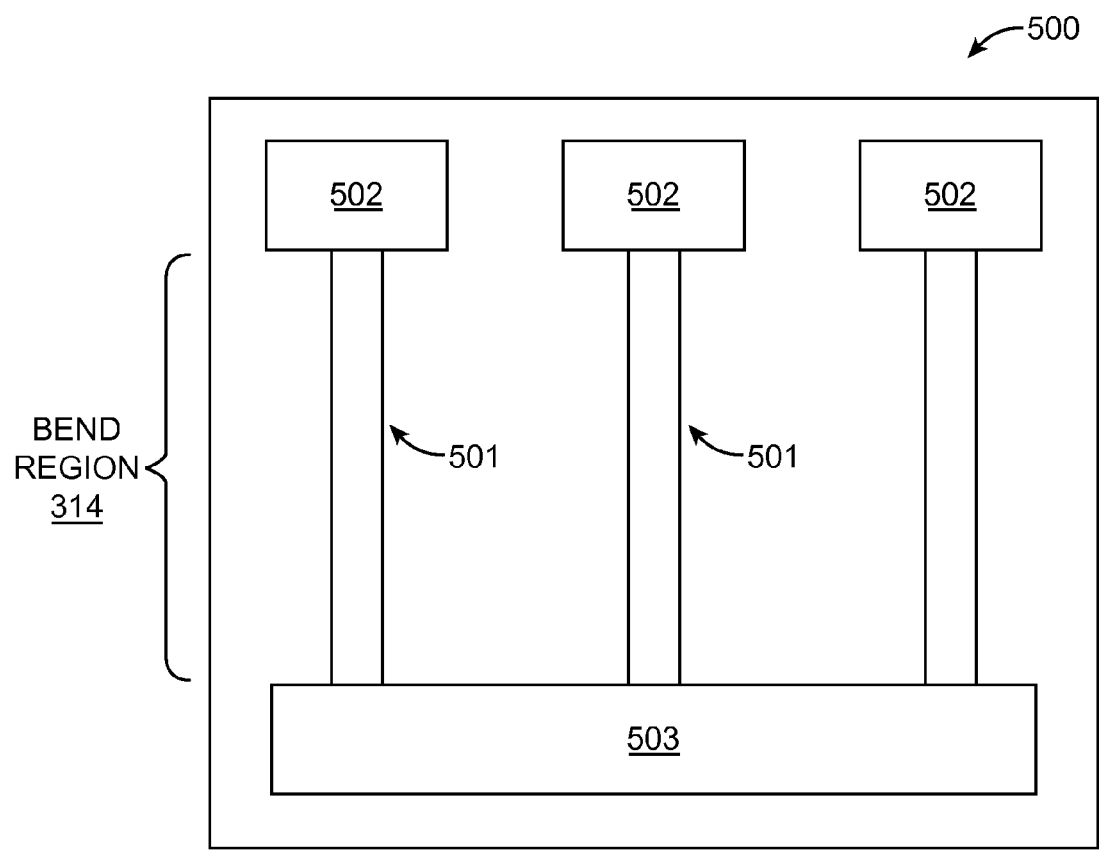
FIG. 17 illustrates a schematic top view of peripheral circuitry arrangements for display devices, in accordance with an embodiment of the present invention.

Additionally, gate regions of a display device may be arranged to allow for bending without disruption to device operation. For example, FIG. 17 illustrates a schematic top view of peripheral circuitry arrangements for display devices, according to an exemplary embodiment of the present invention. As shown, peripheral circuitry components 502 and 503 of a region to be bent 500 may be separated by intervening bent electrical interconnections 501. The electrical interconnections 501 may take any form of the electrodes discussed above, or may take other suitable forms. In general, due to the bend region 314 lying between components 502 and 503, possibility of component failure may be reduced.

In addition to the alternate planar arrangements of electrical interconnections described above, cross-sectional characteristics of electrodes may be altered to decrease probability of severance of electrical conductivity about a bend or fold region. For example, FIGS. 18A-18C illustrate cross sectional views of alternate electrical interconnection arrangements for display devices, according to exemplary embodiments of the present invention.

Figure 18A:
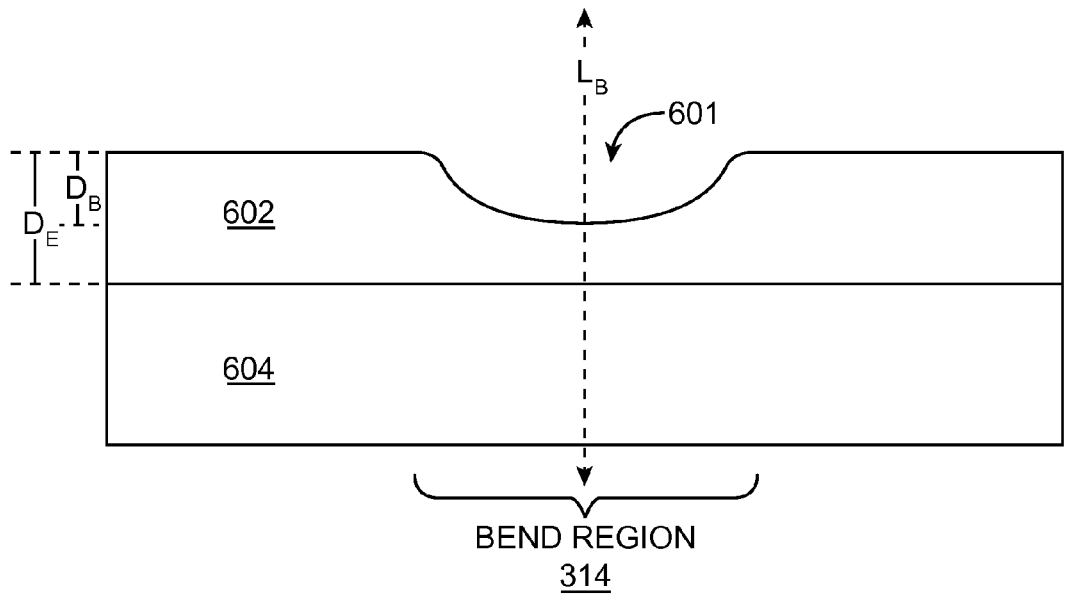
FIGS. 18A-18C illustrate cross sectional views of alternate electrical interconnection arrangements for display devices, in accordance with an embodiment of the present invention.

Turning to FIG. 18A, an electrode 602 arranged on a layer 604 may include a bend thickness DB substantially less than an overall electrode thickness DE within a bend region 314 to promote stretching of thinner electrode material 601 about bend line LB without significant breakage or loss of electrical conductivity.

Figure 18B:
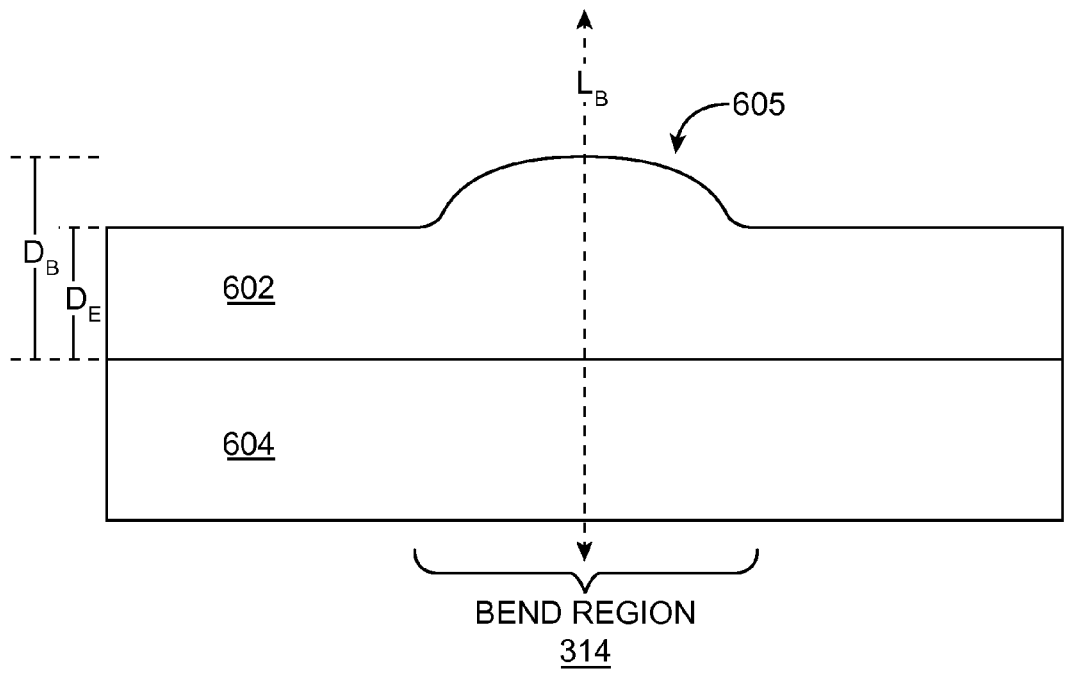

Turning to FIG. 18B, an electrode 602 arranged on a layer 604 may include a bend thickness DB substantially greater than an overall electrode thickness DE within a bend region 314 to promote stretching of thicker electrode material 605 about bend line LB without significant breakage or loss of electrical conductivity.

Figure 18C:
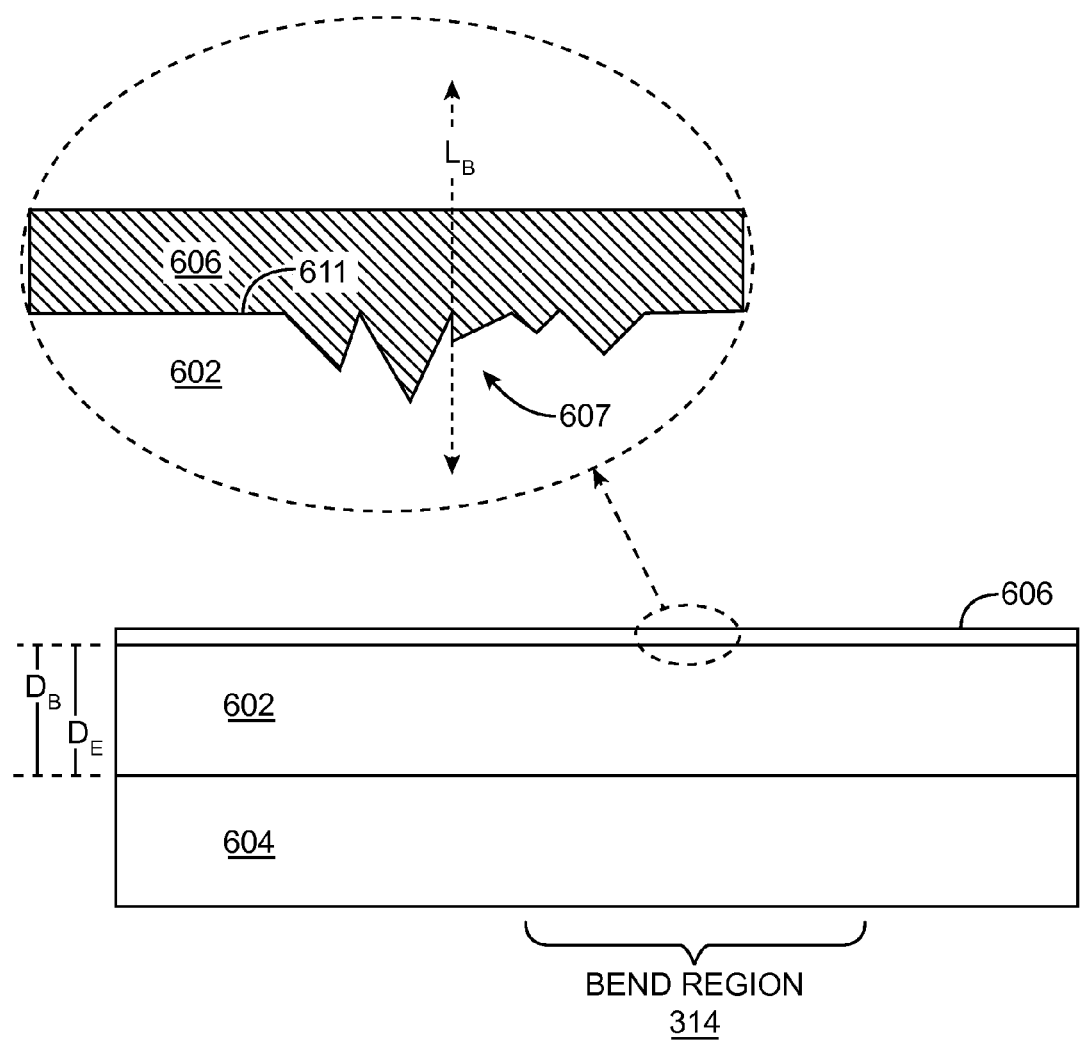

Turning to FIG. 18C, an electrode 602 arranged on a layer 604 may include a bend thickness DB substantially equal to an overall electrode thickness DE within a bend region 314, and may further include a flexible or semi-solid conductive layer 606 arranged thereon. The flexible or semi-solid conductive layer 606 may be formed of conductive ink, relatively soft or pliable conductive material, or suspended conductive material in an adhesive film to promote filling of surface imperfections or breakage 607 of an outer surface 611 formed about bend line LB to promote electrical conductivity after a bending process. Alternatively, or in combination, the surfaces 611 may be post-processed after a bending process step to fill surface imperfections or breakage, for example, by applying a layer 606.

The same may be extensible to any other portion of a display device for an exemplary repair operation performed prior, during, or after a bending operation. Additionally, an additional or supplemental encapsulation layer may be applied to reduce corrosion or breakage of an encapsulation layer 201 from bending. Also, bending may be performed in an inert environment, with repair or encapsulation being applied after bending of a portion or portions of any suitable substrate. In this manner, the embodiments described above may be manipulated to suit any desired application, including those not particularly illustrated.

Hereinafter, overall process flows of methods of forming display devices are presented in detail, with reference to FIGS. 19 and 20.

Figure 19:
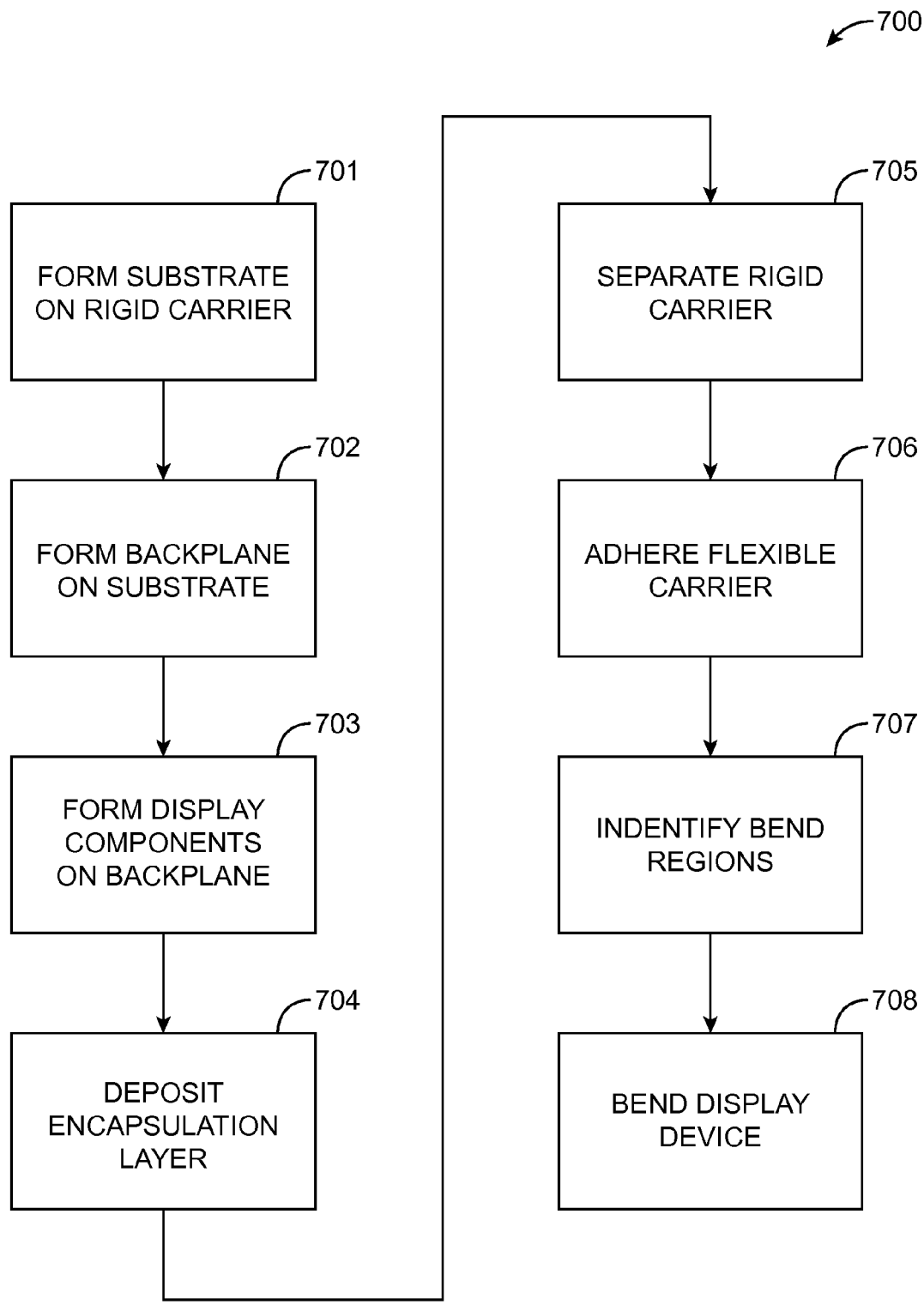
FIG. 19 is a flow chart of a method of forming a display device, in accordance with an embodiment of the present invention.

Turning to FIG. 19, a flow chart of a method of forming a display device is illustrated, according to an exemplary embodiment of the present invention. As shown, the method 700 includes forming a first substrate on a rigid carrier at block 701.

The method 700 further includes forming a backplane on the first substrate at block 702. The backplane may include display device interconnections and other components.

The method 700 further includes forming display components on the backplane at block 703. The display components may include a plurality of display pixels for a display panel, peripheral circuitry such as gate control circuitry, and other suitable display components.

The method 700 further includes forming an encapsulation layer on the backplane and display components at block 704. The encapsulation layer may be a protective film or multi-layered film configured to protect the display device.

The method 700 further includes separating the rigid carrier from the first substrate at block 705. Separation may be facilitated through chemical or mechanical separation, for example, through use or solvents, separation tools, etc.

The method 700 further includes adhering a flexible carrier to the first substrate at block 706. The adhering may be facilitated through use of adhesives, heat, or other means for adhesion.

The method 700 further includes identifying bend or fold regions of the display device (e.g., bend or fold regions of the flexible carrier and/or other display layers) at block 707. The identifying may be facilitated with optical fiducials, optical markers, measurement, or other means for identification.

The method 700 further includes bending the display device (e.g., by bending the flexible carrier and/or some or all of the display layers such as the substrate, the backplane, the encapsulation layer or other display layers that extend into the bend region) within the bend or fold regions at block 708. The bending may be facilitated through use of a clamping member, pre-heating the display device within or near the identified bend or fold regions, application of mechanical force about a bend line, or any other means for bending. The bending may also include repair operations or coatings applied after bending to promote electrical conductivity along damaged electrical interconnections.

Figure 20:
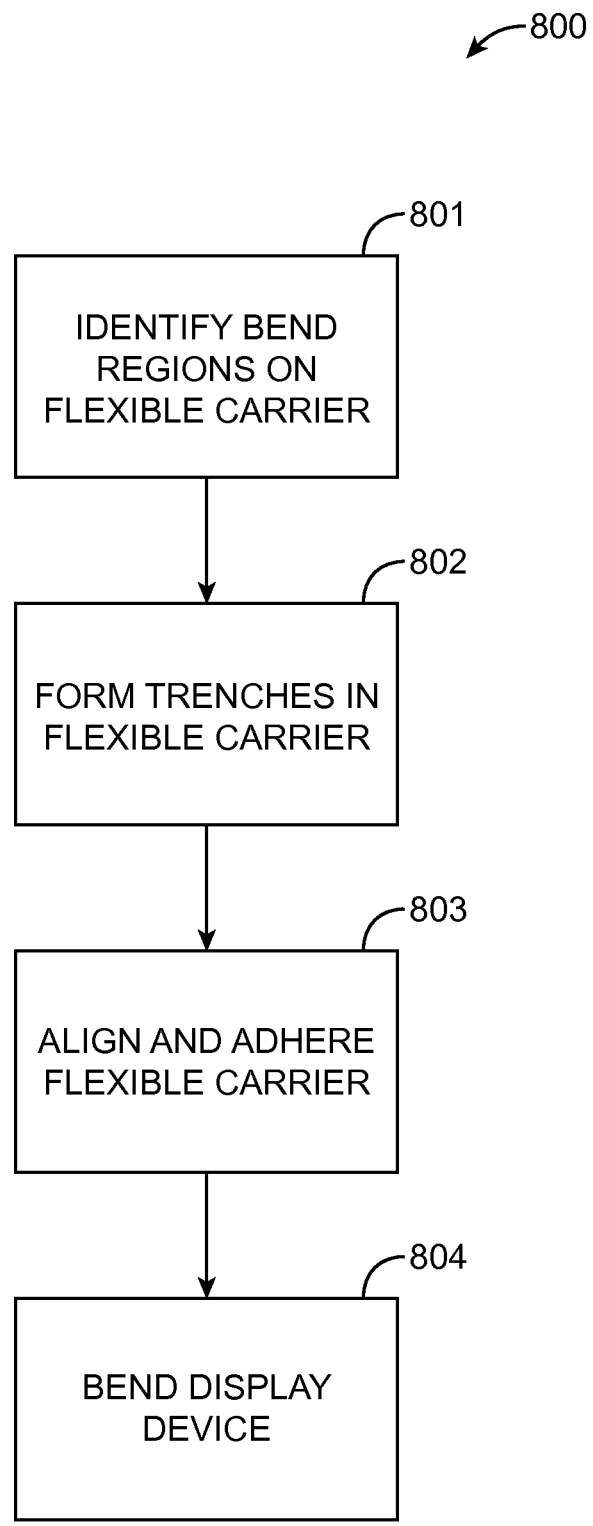
FIG. 20 is a flow chart of a method of forming a display device, in accordance with an embodiment of the present invention.

Turning to FIG. 20, a flow chart of a method of forming a display device is illustrated, according to an exemplary embodiment of the present invention. As shown, the method 800 includes identifying bend or fold regions on a flexible carrier at block 801. The identifying may be facilitated with optical markers, optical fiducials, measurement, placement in a mechanical jig, or other means for identification.

The method 800 further includes forming trenches (e.g., a series of trenches such as a series of triangular trenches) in the flexible carrier within the bend or fold region at block 802. The trenches may take any desired cross sectional shape configured to reduce mechanical stress associated with bending the substrate about or within the identified bend or fold regions.

The method 800 further includes aligning and adhering the flexible carrier to a display layers at block 803. Aligning may be facilitated through optical markers or other means, and adhering may be facilitated through any suitable means for adhering. The display layers may include a backplane layer, a substrate layer, a display panel, peripheral circuitry, electrode layers, an encapsulation layer, coatings, or other layers for the display device.

The method 800 further includes bending the display device (e.g., by bending the flexible carrier and/or some or all of the display layers such as the substrate and the backplane) of the within the bend or fold regions at block 804. The bending may be facilitated through use of a clamping member, pre-heating the display device within or near the identified bend or fold regions, application of mechanical force about a bend line, or any other means for bending. The bending may also include repair operations or coatings applied after bending to promote electrical conductivity along damaged electrical interconnections.

Although described above with reference to OLED display technology, it should be understood that the concepts and teachings herein may be extensible to any form of flexible display technology, such as electrophoretic, liquid crystal, electrochromic, displays comprising discreet inorganic LED emitters on flexible substrates, electrofluidic, and electrokinetic displays, as well as any other suitable form of display technology.

As described above, display devices may include a plurality of innovations configured to allow bending of a portion or portions of a periphery thereof to reduce apparent border regions and decrease a surface area of inactive components (e.g., border area) of an assembled display device. Electrode materials may be optimized to promote stretching rather than breaking within a bend or fold region. Electrodes may be angled, meandering, waving, or otherwise arranged to reduce possibility of severance during bending. Electrode thickness may be altered and/or optimized to reduce breakage during bending. Conductive films may be applied to electrodes before, during, or after bending in a repair process. Mechanical stresses may be reduced by adding protective films over components in addition to disclosed encapsulation layers. A temperature of a substrate to be bent may be increased slightly or significantly to promote bending without breakage. Metals such as stainless steel with a passive dielectric layer may be used as bendable or flexible substrates rather than conventional materials. Optical markers and/or fiducials may be used in several identification and aligning process steps to ensure appropriate bends absent breakage of sensitive components. Electrical interconnection thickness may be varied across a bend or fold region to minimize stresses about the bend or fold region. A display panel may be actively monitored during device assembly and bending operations to monitor damage to components and interconnections. Bending may be performed only in bend or fold regions having only metal or electrical traces rather than active display components or peripheral circuitry in some embodiments. Separate conductors may be used in bend or fold regions such as conductive ink, copper, or aluminum to promote bending rather than breaking during bend operations. Furthermore, bending operations may be performed in inert atmospheres with re-coat or repair applications performed during or after the bending operations.

These various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium may be any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing is merely illustrative of the principles of this invention and various modifications can be made by those skilled in the art without departing from the scope and spirit of the invention.

What is claimed is:

1. A display, comprising:
   a first polymer layer with an active area that contains an array of thin-film transistors and an inactive area that includes at least one bent edge portions of the first polymer layer; and
   a second polymer layer attached to the first polymer layer, wherein the second polymer layer includes at least one neutral plane adjustment feature that facilitates bending of the bend edge portion of the first polymer layer, wherein the second polymer layer comprises first and second portions, wherein the neutral plane adjustment feature is formed from a gap between the first and second portion, and wherein the gap in the second polymer layer exposes the first polymer layer.

2. The display defined in claim 1 wherein the first polymer layer comprises polyimide.

3. The display defined in claim 2 wherein the second polymer layer comprises polyethylene terephthalate.

4. The display defined in claim 1 wherein the bent edge portion of the first polymer layer extends beyond an edge of the second polymer layer and bends around the edge of the second polymer layer.

5. The display defined in claim 1 wherein the gap extends along at least some of the bent edge portions of the first polymer layer.

6. The display defined in claim 1 wherein the first portion of the second polymer layer is attached to the first polymer layer in the active area and the second portion of the second polymer layer is attached to the bent edge portion of the first polymer layer.

7. The display defined in claim 1, further comprising:
   conductive traces on the first polymer layer that extend from the active area over the bent edge portion, wherein each conductive trace splits into multiple sub-traces on the bent edge portion of the first polymer layer.

8. The display defined in claim 7 wherein the multiple sub-traces of each conductive trace comprise at least four sub-traces.

9. A method of forming an organic light-emitting diode display, comprising:
   forming display structures including an array of thin-film transistors on an active area of a polymer substrate that is attached to a glass carrier substrate;
   attaching an integrated circuit to an inactive area of the polymer substrate;
   removing the glass carrier substrate;
   attaching a polymer backfilm layer to the polymer substrate; and
   bending an edge region of the polymer substrate in the inactive area, wherein the edge region of the polymer substrate is adjacent to a neutral plane adjustment feature in the polymer backfilm layer, wherein the polymer backfilm layer comprises first and second portions, wherein the neutral plane adjustment feature is formed from a gap between the first and second portions, and wherein the gap in the polymer backfilm layer exposes the polymer substrate.

10. The method defined in claim 9, further comprising:
   removing at least some of the polymer backfilm layer that has been attached to the polymer substrate to form the gap.

11. The method defined in claim 10 wherein removing the at least some of the polymer backfilm layer that has been attached to the polymer substrate comprises cutting the polymer backfilm layer along the edge region of the polymer substrate.

12. The method defined in claim 9 wherein attaching the polymer backfilm layer to the polymer substrate comprises attaching a pre-cut polymer backfilm layer having the neutral plane adjustment feature to the polymer substrate.

13. A display device with a reduced border region, comprising:
   a polymer substrate having an active area and an inactive area;
   a plurality of display pixel and an array of thin-film transistors in the active area of the polymer substrate;
   peripheral circuitry in the inactive area of the polymer substrate that is proximate to the display panel and that is configured to drive the plurality of display pixels; and
   a flexible polymer carrier attached to the polymer substrate, wherein a portion of the polymer substrate in the inactive area and a portion of the flexible polymer carrier are bent substantially orthogonal to the display pixels, wherein the flexible polymer carrier comprises first and second portions wherein a bend region of the flexible polymer, and wherein the gap in the flexible polymer carrier exposes the polymer substrate.

14. The display device defined in claim 13, further comprising:
   at least one electrode coupled to the peripheral circuitry, wherein a bend region of the polymer substrate includes a portion of the at least one electrode.

15. The display device defined in claim 14 wherein the peripheral circuitry comprises a first component and a second component and wherein the portion of the at least one electrode comprises a bent electrical interconnection between the first component and the second component.

16. The display device defined in claim 15 wherein the bent electrical interconnection is configured to conduct display communication signals between the first component and the second component.

17. The display device defined in claim 14 wherein the portion of the at least one electrode in the bend region of the polymer substrate is arranged in a pattern selected from the group consisting of a waving pattern, a sinusoidal pattern, an alternating pattern, and a disruptive planar pattern.

18. The display device defined in claim 14 wherein the at least one electrode includes an additional portion that is located outside the bend region of the polymer substrate, wherein the portion of the at least one electrode is formed from a flexible conductor, and wherein the additional portion of the at least one electrode is formed from a conductive material that is different from the flexible conductor.

19. The display device defined in claim 14 wherein the at least one electrode includes an additional portion that is located outside the bend region of the polymer substrate, wherein the portion of the at least one electrode has a bend thickness, and wherein the additional portion of the at least one electrode has a thickness that is greater than the bend thickness.

20. The display device defined in claim 14 wherein the at least one electrode includes an additional portion that is located outside the bend region of the polymer substrate, wherein the portion of the at least one electrode has a bend thickness, and wherein the additional portion of the at least one electrode has a thickness that is less than the bend thickness.

21. The display device defined in claim 14, further comprising:
conductive material that is suspended in an adhesive film that fills surface imperfections in an outer surface of the portion of the at least one electrode.

22. A method of forming a display, comprising:
identifying a bend region on a flexible carrier substrate comprising polymer;
forming a gap in the flexible carrier substrate in the bend region such that the gap separates a first portion and a second portion of the flexible carrier substrate;
attaching the flexible carrier substrate to display layers, wherein the display layers comprise at least one an array of thin-film transistors in the active area; and
bending the flexible carrier substrate and at least some of the attached display layers in the bend region, wherein the bend region of the flexible carrier substrate overlaps the inactive area of the polymer substrate, and wherein the gap in the flexible carrier substrate exposes the polymer substrate.

23. The method defined in claim 22, further comprising:
before identifying the bend region on the flexible carrier substrate, attaching a polymer substrate to a rigid carrier; and
forming a display panel and peripheral circuitry on the polymer substrate to form the display layers.

24. The method defined in claim 23, further comprising:
separating the substrate from the rigid carrier.

25. The method defined in claim 24 wherein attaching the flexible carrier substrate to the display layers comprises attaching a first surface of the flexible carrier substrate to the polymer substrate.

26. The method defined in claim 25 wherein bending the flexible carrier substrate and the at least some of the attached display layers in the bend region comprises:
bending the polymer substrate and the flexible carrier substrate substantially orthogonal to the display panel at a bend line that intersects the gap.

* * * * *